US012542102B2

United States Patent
Du et al.

(10) Patent No.: US 12,542,102 B2
(45) Date of Patent: Feb. 3, 2026

(54) ORGANIC LIGHT EMITTING DIODE (OLED) DISPLAY SUBSTRATE AND DISPLAY APPARATUS INCORPORATING PHOTOSENSITIVE CAMERA SENSOR

(71) Applicants: Chengdu BOE Optoelectronics Technology Co., Ltd., Sichuan (CN); BOE Technology Group Co., Ltd., Beijing (CN)

(72) Inventors: Lili Du, Beijing (CN); Weiyun Huang, Beijing (CN); Yu Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 360 days.

(21) Appl. No.: 18/015,082

(22) PCT Filed: Feb. 25, 2022

(86) PCT No.: PCT/CN2022/078071
§ 371 (c)(1),
(2) Date: Jan. 9, 2023

(87) PCT Pub. No.: WO2023/159509
PCT Pub. Date: Aug. 31, 2023

(65) Prior Publication Data
US 2025/0095568 A1    Mar. 20, 2025

(51) Int. Cl.
*G09G 3/3233*    (2016.01)

(52) U.S. Cl.
CPC ... *G09G 3/3233* (2013.01); *G09G 2300/0465* (2013.01); *G09G 2300/0842* (2013.01);
(Continued)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS

| 2009/0127559 A1* | 5/2009 | Morita | H10D 86/40 |
| | | | 257/E33.044 |
| 2014/0111404 A1* | 4/2014 | Omata | H10K 59/1216 |
| | | | 345/76 |

(Continued)

FOREIGN PATENT DOCUMENTS

| CN | 111508377 A | 8/2020 |
| CN | 111682055 A | 9/2020 |

(Continued)

*Primary Examiner* — Ke Xiao
*Assistant Examiner* — Nelson Lam
(74) *Attorney, Agent, or Firm* — Ling Wu; Stephen Yang; Ling and Yang Intellectual Property

(57) ABSTRACT

Disclosed is a display substrate, including a first display region (A1) and a second display region (A2) at least partially surrounding the first display region (A1). The display substrate includes a base substrate (30), a pixel circuit, and a light emitting element. The pixel circuit is located on the base substrate (30) of the second display region (A2), and the pixel circuit includes a first pixel circuit (11) and a second pixel circuit (12) arranged alternately. The light emitting element is located on a side of the pixel circuit away from the base substrate (30), and the light emitting element includes a first light emitting element (EL1) located in the first display region (A1) and a second sub-light emitting element and a third sub-light emitting element located in the second display region (A2).

18 Claims, 22 Drawing Sheets

(52) U.S. Cl.
CPC . *G09G 2310/08* (2013.01); *G09G 2320/0233* (2013.01); *G09G 2330/021* (2013.01)

(58) Field of Classification Search
CPC .... G09G 3/3233; G09G 3/3241; G09G 3/325; G09G 3/3258; G09G 3/3266; G09G 3/3275; G09G 3/3283; G09G 3/3291
USPC ...................................................... 345/76–83
See application file for complete search history.

(56) References Cited

U.S. PATENT DOCUMENTS

| | | | | |
|---|---|---|---|---|
| 2015/0228223 | A1* | 8/2015 | Park | H10K 59/353 345/77 |
| 2016/0189609 | A1* | 6/2016 | Seo | G09G 3/3233 345/78 |
| 2018/0219058 | A1* | 8/2018 | Xiang | H10K 59/1315 |
| 2020/0052048 | A1* | 2/2020 | Kuo | H10K 59/123 |
| 2020/0286972 | A1* | 9/2020 | Seo | H10K 59/131 |
| 2020/0320929 | A1 | 10/2020 | Pyo et al. | |
| 2021/0012706 | A1* | 1/2021 | Yang | G09G 3/32 |
| 2021/0193769 | A1* | 6/2021 | Bok | H01L 25/167 |
| 2022/0052147 | A1 | 2/2022 | Liu et al. | |
| 2022/0068211 | A1* | 3/2022 | Jeong | H10K 59/131 |
| 2022/0069047 | A1* | 3/2022 | Yang | H10K 59/131 |
| 2022/0102466 | A1* | 3/2022 | Qiu | H10K 59/122 |
| 2022/0123025 | A1 | 4/2022 | Wang et al. | |
| 2022/0123074 | A1 | 4/2022 | Zhang et al. | |
| 2022/0199710 | A1* | 6/2022 | Xu | G06F 1/1686 |
| 2022/0246710 | A1* | 8/2022 | Woo | H10K 59/65 |
| 2022/0285472 | A1 | 9/2022 | Wang et al. | |
| 2022/0328579 | A1 | 10/2022 | Shang et al. | |
| 2022/0376028 | A1 | 11/2022 | Huang et al. | |

FOREIGN PATENT DOCUMENTS

| | | |
|---|---|---|
| CN | 112086492 A | 12/2020 |
| CN | 112259588 A | 1/2021 |
| CN | 112987420 A | 6/2021 |
| CN | 113728439 A | 11/2021 |
| CN | 113728440 A | 11/2021 |
| CN | 113745272 A | 12/2021 |
| CN | 113764462 A | 12/2021 |
| CN | 113853684 A | 12/2021 |
| JP | 2012-133047 A | 7/2012 |
| KR | 2001-0057619 A | 7/2001 |
| KR | 2007-0111149 A | 11/2007 |
| KR | 2008-0031569 A | 4/2008 |

* cited by examiner

ORGANIC LIGHT EMITTING DIODE (OLED) DISPLAY SUBSTRATE AND DISPLAY APPARATUS INCORPORATING PHOTOSENSITIVE CAMERA SENSOR

CROSS-REFERENCE TO RELATED APPLICATION

The present application is a U.S. National Phase Entry of International Application No. PCT/CN2022/078071 having an international filing date of Feb. 25, 2022. The above-identified application is hereby incorporated by reference.

TECHNICAL FIELD

The present disclosure relates to, but is not limited to, the field of display technologies, in particular to a display substrate, a display panel, and a display apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, bendability, and a low cost, etc. An under display camera technology is a brand-new technology proposed to increase a screen-to-body ratio of a display apparatus.

SUMMARY

The following is a summary of subject matters described herein in detail. The summary is not intended to limit the protection scope of claims.

Embodiments of the present disclosure provide a display substrate, a display panel, and a display apparatus.

In one aspect, an embodiment of the present disclosure provides a display substrate including a first display region and a second display region at least partially surrounding the first display region. The display substrate includes a base substrate, a pixel circuit, and a light emitting element. The pixel circuit is located on the base substrate of the second display region. The pixel circuit includes a first pixel circuit and a second pixel circuit that are arranged alternately. The light emitting element is located on a side of the pixel circuit away from the base substrate, and the light emitting element includes a first light emitting element located in the first display region and a second sub-light emitting element and a third sub-light emitting element located in the second display region. The first pixel circuit is electrically connected with the first light emitting element through at least a part of a transparent conductive line. The second pixel circuit is electrically connected with the second sub-light emitting element through a first adapter hole, and an orthographic projection of the first adapter hole on the base substrate is overlapped with an orthographic projection of the third sub-light emitting element on the base substrate.

In some exemplary implementation modes, the third sub-light emitting element is disposed adjacent to the second sub-light emitting element.

In some exemplary implementation modes, at least one second pixel circuit in the second display region is electrically connected with a first adapter line through the first adapter hole, the first adapter line is electrically connected with the second sub-light emitting element, and an orthographic projection of a connection position of the first adapter line and the second sub-light emitting element on the base substrate is not overlapped with an orthographic projection of the third sub-light emitting element on the base substrate.

In some exemplary implementation modes, a first planarization layer is disposed between the first adapter line and a pixel circuit, and the first adapter line is electrically connected with the second pixel circuit through a first adapter hole provided in the first planarization layer. A second planarization layer is disposed between the first adapter line and the light emitting element, and the first adapter line is electrically connected with the second sub-light emitting element through a third adapter hole provided in the second planarization layer. An orthographic projection of the third adapter hole on the base substrate is not overlapped with the orthographic projection of the third sub-light emitting element on the base substrate.

In some exemplary implementation modes, the second display region includes at least one third sub-display region, a first pixel circuit in the third sub-display region is electrically connected with a first light emitting element in the first display region through a first transparent conductive line, and the first transparent conductive line extends at least along a first direction. At least one second pixel circuit in the third sub-display region is electrically connected with the second sub-light emitting element through a first adapter line extending along the first direction.

In some exemplary implementation modes, the second display region includes at least one fourth sub-display region, a first pixel circuit in the fourth sub-display region is electrically connected with a first light emitting element in the first display region through a second transparent conductive line, the second transparent conductive line extends at least along a second direction, and the second direction crosses the first direction. At least one second pixel circuit in the fourth sub-display region is electrically connected with the second sub-light emitting element through a first adapter line extending along the second direction.

In some exemplary implementation modes, the second display region further includes a fifth sub-display region, and a first pixel circuit in the fifth sub-display region is a Dummy pixel circuit. At least one second pixel circuit of the fifth sub-display region is electrically connected with the second sub-light emitting element through a first adapter line extending along any direction.

In some exemplary implementation modes, the first display region includes at least one first sub-display region and at least one second sub-display region. The third sub-display region is adjacent to at least one first sub-display region in the first direction, and the fourth sub-display region is adjacent to at least one second sub-display region in the second direction. Length ranges of the first transparent conductive line and the second transparent conductive line are substantially the same.

In some exemplary implementation modes, the light emitting element further includes a fourth sub-light emitting element located in the second display region. At least one second pixel circuit in the second display region is electrically connected with the fourth sub-light emitting element through the first adapter hole, and an orthographic projection of the first adapter hole on the base substrate is overlapped with an orthographic projection of a light emitting region of the fourth sub-light emitting element on the base substrate.

In some exemplary implementation modes, the second pixel circuit is electrically connected with a second adapter line through the first adapter hole, and the second adapter line is electrically connected with the fourth sub-light emitting element. An orthographic projection of a connection position of the second adapter line and the fourth sub-light emitting element on the base substrate is not overlapped with the orthographic projection of the light emitting region of the fourth sub-light emitting element on the base substrate.

In some exemplary implementation modes, the second display region at least includes a third sub-display region and a fourth sub-display region. A first pixel circuit in the third sub-display region is electrically connected with a first light emitting element in the first display region through a first transparent conductive line, and the first transparent conductive line extends at least along a first direction. A first pixel circuit in the fourth sub-display region is electrically connected with a first light emitting element in the first display region through a second transparent conductive line, and the second transparent conductive line extends at least along a second direction, and the second direction crosses the first direction. At least one second pixel circuit in the third sub-display region is electrically connected with the fourth sub-light emitting element through a second adapter line extending along the first direction. At least one second pixel circuit in the fourth sub-display region is electrically connected with the fourth sub-light emitting element through a second adapter line extending along the second direction.

In some exemplary implementation modes, in the second display region, the first pixel circuit and the second pixel circuit are alternately arranged in both the first direction and the second direction; the first direction crosses the second direction.

In some exemplary implementation modes, in the first direction, four columns of second pixel circuits and one column of first pixel circuits are alternately arranged, and in the second direction, four rows of second pixel circuits and one row of first pixel circuits are alternately arranged.

In some exemplary implementation modes, the pixel circuit includes: a drive transistor and a first transistor; a first electrode of the first transistor is electrically connected with a gate of the drive transistor. The first transistor is a double-gate transistor. The pixel circuit is electrically connected with a first initial signal line, an orthographic projection of the first initial signal line on the base substrate is overlapped with an orthographic projection of a channel region of an active layer of the first transistor on the base substrate.

In some exemplary implementation modes, the channel region of the active layer of the first transistor includes: a first channel region, a second channel region, and a third channel region, the third channel region is located between the first channel region and the second channel region; an orthographic projection of a first gate of the first transistor on the base substrate covers an orthographic projection of the first channel region on the base substrate, and an orthographic projection of a second gate of the first transistor on the base substrate covers an orthographic projection of the second channel region on the base substrate. An orthographic projection of the first initial signal line on the base substrate is overlapped with an orthographic projection of the third channel region of the active layer of the first transistor on the base substrate.

In some exemplary implementation modes, an orthogonal projection of the third channel region on the base substrate is of an inverted L-shape.

In some exemplary implementation modes, the first initial signal line includes a body portion extending along the first direction and a protrusion portion extending from the body portion along the second direction. An orthographic projection of the protrusion portion on the base substrate is overlapped with an orthographic projection of a channel region of an active layer of the first transistor on the base substrate.

In some exemplary implementation modes, the pixel circuit includes a plurality of transistors and at least one storage capacitor; a transistor includes an active layer, a gate, a first electrode, and a second electrode, the storage capacitor includes a first capacitor electrode plate and a second capacitor electrode plate, the gate of the transistor and one of capacitor electrode plates of the storage capacitor are of a same layer structure, and the first electrode and the second electrode of the transistor are of a same layer structure.

In some exemplary implementation modes, the first initial signal line and another capacitor electrode plate of the storage capacitor of the pixel circuit, are of a same layer structure.

In another aspect, an embodiment of the present disclosure provides a display panel, which includes the aforementioned display substrate.

In another aspect, an embodiment of the present disclosure provides a display apparatus, which includes the aforementioned mentioned display panel and a photosensitive sensor disposed on a side of a non-display surface of the display panel, wherein an orthographic projection of the photosensitive sensor on the display panel is overlapped with a first display region of a display substrate of the display panel.

Other aspects may be understood upon reading and understanding the drawings and the detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
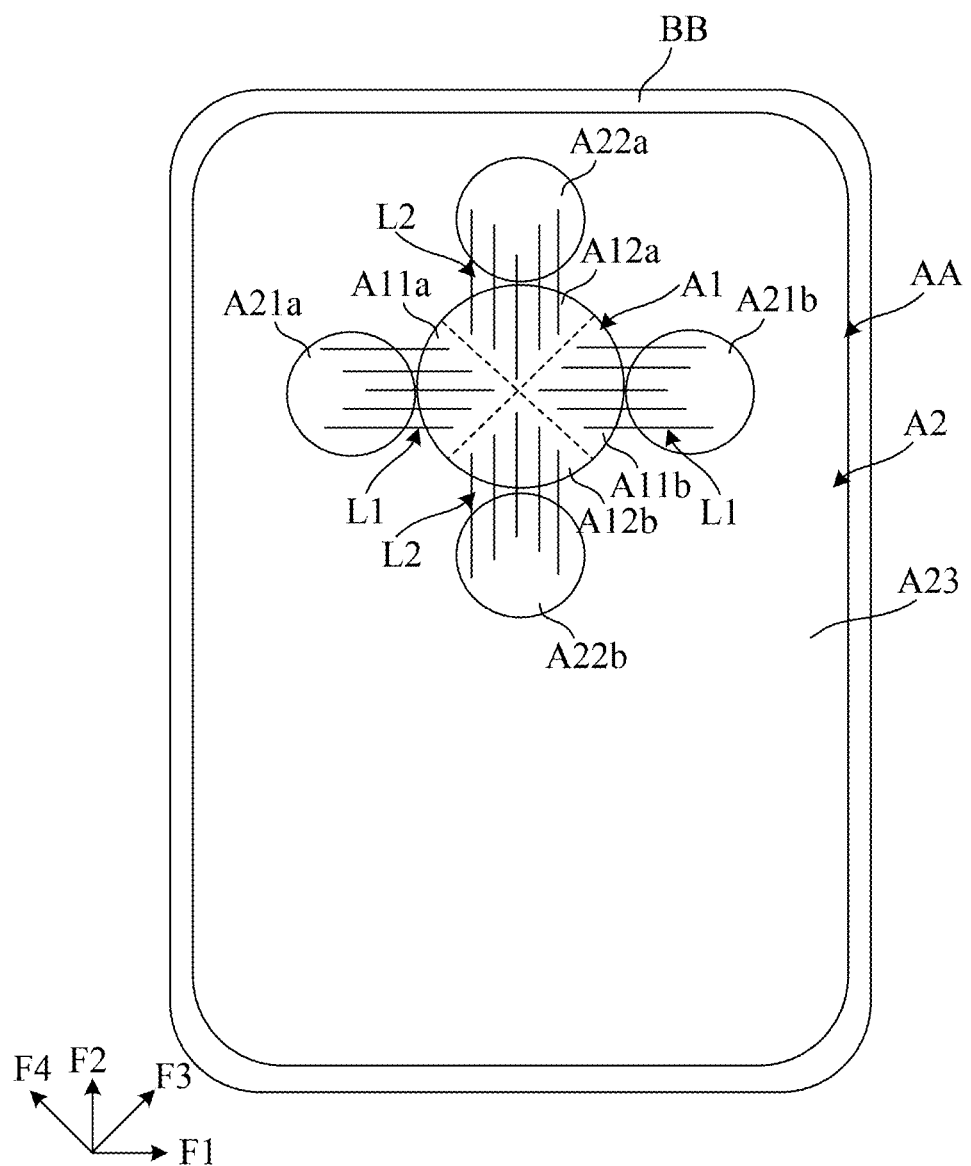
FIG. 1 is a schematic diagram of a display substrate according to at least one embodiment of the present disclosure.

The embodiments of the present disclosure will be described below in combination with the drawings in detail. Implementations may be implemented in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity. In the present disclosure, "a plurality of" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case that constituent elements are connected together through an element with a certain electrical effect. The "element having some electrical function" is not particularly limited as long as electrical signals between the connected constituent elements may be transmitted. Examples of the "element having some electrical function" not only include an electrode and a wiring, but further include a switch element such as a transistor, a resistor, an inductor, a capacitor, another element with a plurality of functions, etc.

In the specification, a transistor refers to an element which at least includes three terminals, i.e., a gate (gate electrode), a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchangeable. Therefore, the "source electrode" and the "drain electrode" may be exchangeable in the specification. In addition, the gate may also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

A "light transmission rate" in the present disclosure refers to an ability of light to pass through a medium, and is a percentage of the luminous flux passing through a transparent or translucent body to its incident luminous flux.

In the present disclosure, "about" and "substantially" refer to a case that a boundary is not defined strictly and a process and measurement error within a range is allowed. In the present disclosure, "substantially the same" is a case where values differ by less than 10%.

An embodiment of the present disclosure provides a display substrate including a first display region and a second display region at least partially surrounding the first display region. The display substrate includes a base substrate, a pixel circuit, and a light emitting element. The pixel circuit is located on the base substrate of the second display region. The pixel circuit includes a first pixel circuit and a second pixel circuit that are arranged alternately. The light emitting element is located on a side of the pixel circuit away from the base substrate, and the light emitting element includes a first light emitting element located in the first display region and a second sub-light emitting element and a third sub-light emitting element located in the second display region. The first pixel circuit is electrically connected with the first light emitting element through at least a part of a transparent conductive line. The second pixel circuit is electrically connected with the second sub-light emitting element through a first adapter hole, and an orthographic projection of the first adapter hole on the base substrate is overlapped with an orthographic projection of the third sub-light emitting element on the base substrate.

In some examples, the third sub-light emitting element of the second display region is disposed adjacent to the second sub-light emitting element. However, this embodiment is not limited thereto. For example, the second sub-light emitting element and the third sub-light emitting element may not be disposed adjacent to each other, and remaining sub-light emitting elements are also arranged between the second sub-light emitting element and the third sub-light emitting element.

In some exemplary implementation modes, at least one second pixel circuit in the second display region is electrically connected with a first adapter line through the first adapter hole, and the first adapter line is electrically connected with the second sub-light emitting element. An orthographic projection of a connection position of the first adapter line and the second sub-light emitting element on the base substrate is not overlapped with an orthographic projection of the third sub-light emitting element on the base substrate. In the display substrate provided in this example, because the second pixel circuit and the first pixel circuit are disposed in the second display region, the second pixel circuit and a corresponding electrically connected light emitting element are dislocated, and if the second pixel circuit is directly electrically connected with the light emitting element, there is a case where the light emitting element is short-circuited. In this embodiment, aiming at the second sub-light emitting element with short circuit, the second pixel circuit and the second sub-light emitting element are electrically connected through the first adapter line, so that short circuit of the second sub-light emitting element and the third sub-light emitting element may be avoided, thereby improving a display effect.

In some exemplary implementation modes, a first planarization layer is disposed between the first adapter line and a pixel circuit, and the first adapter line is electrically connected with the second pixel circuit through a first adapter hole provided in the first planarization layer. A second planarization layer is disposed between the first adapter line and a light emitting element, and the first adapter line is electrically connected with the second sub-light emitting element through a third adapter hole provided in the second planarization layer. An orthographic projection of the third adapter hole on the base substrate is not overlapped with an orthographic projection of the third sub-light emitting element on the base substrate. In the display substrate provided in this example, by using the first adapter line, a connection position of the second pixel circuit and the second sub-light emitting element is transferred from a position where the first adapter hole is located to a position where the third adapter hole is located, so that the connection position of the second pixel circuit and the second sub-light emitting element is not overlapped with the orthographic projection of the third sub-light emitting element on the base substrate, thereby avoiding a case where a light emitting element is short-circuited. In some examples, an orthographic projection of the first adapter hole on the base substrate and an orthographic projection of the third adapter hole on the base substrate may be partially overlapped or are not overlapped. However, this embodiment is not limited thereto.

In some exemplary implementation modes, the second display region includes at least one third sub-display region, a first pixel circuit in the third sub-display region is electrically connected with the first light emitting element in the first display region through a first transparent conductive line. The first transparent conductive line extends at least along a first direction. At least one second pixel circuit in the third sub-display region is electrically connected with the second sub-light emitting element through a first adapter line extending along the first direction. In this example, by electrically connecting the second pixel circuit and the second sub-light emitting element in the third sub-display region with the first adapter line extending along the first direction, more wiring space may be reserved for the first transparent conductive line.

In some exemplary implementation modes, the second display region may include at least one fourth sub-display region, a first pixel circuit of the fourth sub-display region being electrically connected with the first light emitting element in the first display region through a second transparent conductive line. The second transparent conductive line extends at least along a second direction. The second direction interacts with the first direction. At least one second pixel circuit in the fourth sub-display region is electrically connected with the second sub-light emitting element through a first adapter line extending along the second direction. In this example, by electrically connecting the second pixel circuit and the second sub-light emitting element in the fourth sub-display region with the first adapter line extending along the second direction, more wiring space may be reserved for the second transparent conductive line.

In some exemplary implementation modes, the second display region may further include a fifth sub-display region. A first pixel circuit in the fifth sub-display region is a Dummy pixel circuit. At least one second pixel circuit of the fifth sub-display region is electrically connected with the second sub-light emitting element through a first adapter line extending along any direction. In this example, the first transparent conductive line and the second transparent conductive line are not arranged in the fifth sub-display region, so that an extension direction of a first adapter line may not be limited by a transparent conductive line.

In some exemplary implementation modes, the first display region may include at least one first sub-display region and at least one second sub-display region. The third sub-display region is adjacent to at least one first sub-display region in the first direction, and the fourth sub-display region is adjacent to at least one second sub-display region in the second direction. Length ranges of the first transparent conductive line and the second transparent conductive line are substantially the same.

In this example, the first display region is divided into the first sub-display region and the second sub-display region, the first light emitting element of the first sub-display region is electrically connected with the first pixel circuit in the second display region adjacent to the first light emitting element in the first direction, and the first light emitting element of the second sub-display region is electrically connected with the first pixel circuit in the second display region adjacent to the first light emitting element in the second direction, which is beneficial to reducing lengths of the first transparent conductive line and the second transparent conductive line, improving a display effect, and improving a size limitation on the first display region.

For example, in a case where a size of the first display region is constant, compared with a solution in which the first light emitting element of the first display region is only electrically connected with the first pixel circuit of the second display region adjacent to the first light emitting element in the first direction, in this embodiment, the first light emitting element of the first sub-display region is electrically connected with the first pixel circuit of the second display region adjacent to the first light emitting element in the first direction, and the first light emitting element of the second sub-display region is electrically connected with the first pixel circuit of the second display region adjacent to the first light emitting element in the second direction, a transparent conductive line electrically connecting the first light emitting element and the first pixel circuit may be avoided from being too long, and an arrangement range of the first transparent conductive line and the second transparent conductive line may be expanded without limiting a quantity of the first transparent conductive line and the second transparent conductive line.

For example, in a case where maximum lengths of the first transparent conductive line and the second transparent conductive line are constant, compared with a solution in which the first light emitting element of the first display region is only electrically connected with the first pixel circuit of the second display region adjacent in the first direction, in this embodiment, the first light emitting element of the first sub-display region is electrically connected with the first pixel circuit of the second display region adjacent in the first direction, and the first light emitting element of the second sub-display region is electrically connected with the first pixel circuit of the second display region adjacent in the second direction, so that a size of the first display region may be increased.

In some exemplary implementation modes, the first display region may include two first sub-display regions sequentially arranged along the first direction, and two second sub-display regions sequentially arranged along the second direction. The second display region may include two third sub-display regions arranged along the first direction and two fourth sub-display regions arranged along the second direction. In the first direction, one third sub-display region is adjacent to one first sub-display region; in the second direction, one fourth sub-display region is adjacent to one second sub-display region. However, this embodiment is not limited thereto.

In some exemplary implementation modes, the first adapter line, the first transparent conductive line, and the second transparent conductive line may be of a same layer structure. However, this embodiment is not limited thereto. For example, at least two of the first adapter line, the first transparent conductive line, and the second transparent conductive line may be of a different-layer structure. Or, for example, the first transparent conductive line and the second transparent conductive line may be of a multi-layer structure.

In some exemplary implementation modes, a light emitting element may further include a fourth sub-light emitting element located in the second display region. At least one second pixel circuit in the second display region is electrically connected with the fourth sub-light emitting element through the first adapter hole, and an orthographic projection of the first adapter hole on the base substrate is overlapped with an orthographic projection of a light emitting region of the fourth sub-light emitting element on the base substrate.

In some exemplary implementation modes, the second pixel circuit is electrically connected with the second adapter line through the first adapter hole, and the second adapter line is electrically connected with the fourth sub-light emitting element. An orthographic projection of a connection position of the second adapter line and the fourth sub-light emitting element on the base substrate is not overlapped with an orthographic projection of a light emitting region of the fourth sub-light emitting element on the base substrate. In the display substrate provided in this example, because the second pixel circuit and the first pixel circuit are disposed in the second display region, the second pixel circuit and a corresponding electrically connected light emitting element are dislocated, and if the second pixel circuit is directly electrically connected with the light emitting element, there is a case where an aperture ratio of the light emitting element may be lost. According to this embodiment, aiming for the fourth sub-light emitting element having loss of aperture ratio, the second pixel circuit is electrically connected with the fourth sub-light emitting element through the second adapter line, so that the loss of aperture ratio of the fourth sub-light emitting element may be avoided, thereby improving a display effect.

Solutions of the embodiment will be described below through some examples.

FIG. 1 is a schematic diagram of a display substrate according to at least one embodiment of the present disclosure. In some exemplary implementation modes, as shown in FIG. 1, the display substrate may include a display region AA and a peripheral region BB surrounding the display region AA. The display region AA of the display substrate may include a first display region A1 and a second display region A2 at least partially surrounding the first display region A1. In this example, the second display region A2 surrounds the first display region A1.

In some exemplary implementation modes, the first display region A1 is a light-transmitting display region and may also be referred to as a Under Display Camera (UDC) region; the second display region A2 is a non-light-transmitting display region and may also be referred to as a normal display region. For example, an orthographic projection of a photosensitive sensor (such as a camera and other hardware) on the display substrate may be located in the first display region A1 of the display substrate. In some examples, as shown in FIG. 1, the first display region A1 may be circular and a size of the orthographic projection of the photosensitive sensor on the display substrate may be less than or equal to a size of the first display region A1. However, this embodiment is not limited thereto. In other examples, the first display region A1 may be rectangular, and a size of the orthographic projection of the photosensitive sensor on the display substrate may be less than or equal to a size of an inscribed circle of the first display region A1.

In some exemplary implementation modes, as shown in FIG. 1, the first display region A1 may be located at a center position of the top of the display region AA. The second display region A2 may surround the first display region A1. However, this embodiment is not limited thereto. For example, the first display region A1 may be located in other positions such as an upper left corner or an upper right corner of the display region AA. For example, the second display region A2 may surround at least one side of the first display region A1.

In some exemplary implementation modes, as shown in FIG. 1, the display region AA may have a shape of a rectangle, e.g., a rounded rectangle. The first display region A1 may be circular or elliptical. However, this embodiment is not limited thereto. For example, the first display region A1 may be rectangular, pentagonal, hexagonal, or have another shape.

In some exemplary implementation modes, the display region AA is provided with a plurality of sub-pixels. At least one sub-pixel includes a pixel circuit and a light emitting element. The pixel circuit is configured to drive a connected light emitting element. For example, the pixel circuit is configured to provide a drive current to drive the light emitting element to emit light. The pixel circuit may include a plurality of transistors and at least one capacitor. For example, the pixel circuit may be of a 3T1C (three transistors and one capacitor) structure, a 7T1C (seven transistors and one capacitor) structure, a 5T1C (five transistors and one capacitor) structure, or the like. In some examples, the light emitting element may be an Organic Light Emitting Diode (OLED), and the light emitting element emits red light, green light, blue light, or white light, etc. when driven by a pixel circuit corresponding to the light emitting element. A color of light emitted from the light emitting element may be determined as required. In some examples, the light emitting element may include an anode, a cathode, and an organic emitting layer disposed between the anode and the cathode. The anode of the light emitting element may be electrically connected with a corresponding pixel circuit. However, this embodiment is not limited thereto.

In some exemplary implementation modes, one pixel unit in the display region may include three sub-pixels, wherein the three sub-pixels may be a red sub-pixel, a green sub-pixel, and a blue sub-pixel respectively. However, this embodiment is not limited thereto. In some examples, one pixel unit may include four sub-pixels, which may be a red sub-pixel, a green sub-pixel, a blue sub-pixel, and a white sub-pixel respectively.

In some exemplary implementation modes, a shape of the light emitting element may be a rectangle, a rhombus, a pentagon, or a hexagon. When a pixel unit includes three sub-pixels, light emitting elements of the three sub-pixels may be arranged side by side horizontally, side by side vertically, or in a manner like a Chinese character "品". When a pixel unit includes four sub-pixels, light emitting elements of the four sub-pixels may be arranged side by side horizontally, side by side vertically, or in a manner to form a square. However, this embodiment is not limited thereto.

Figure 2:
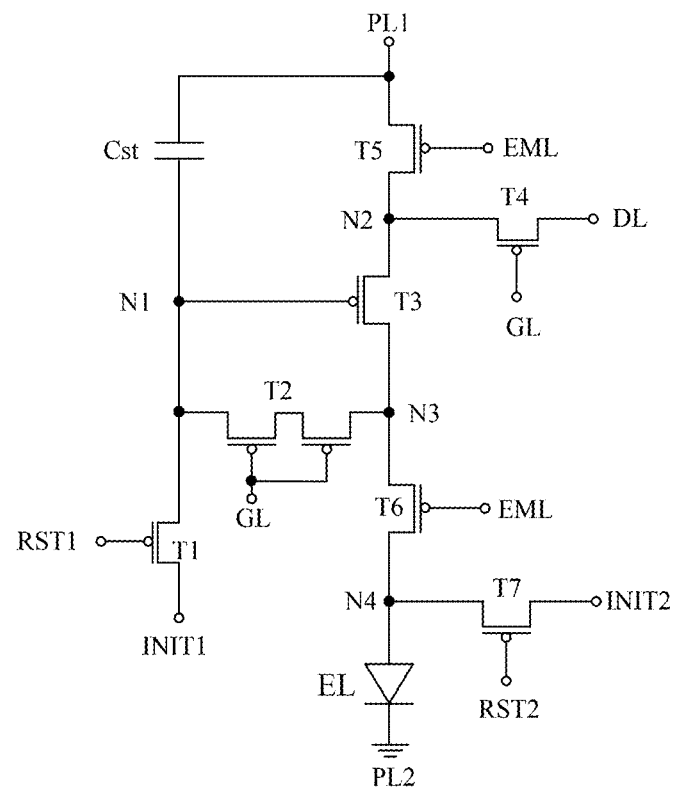
FIG. 2 is an equivalent circuit diagram of a pixel circuit according to at least one embodiment of the present disclosure.
Figure 3:
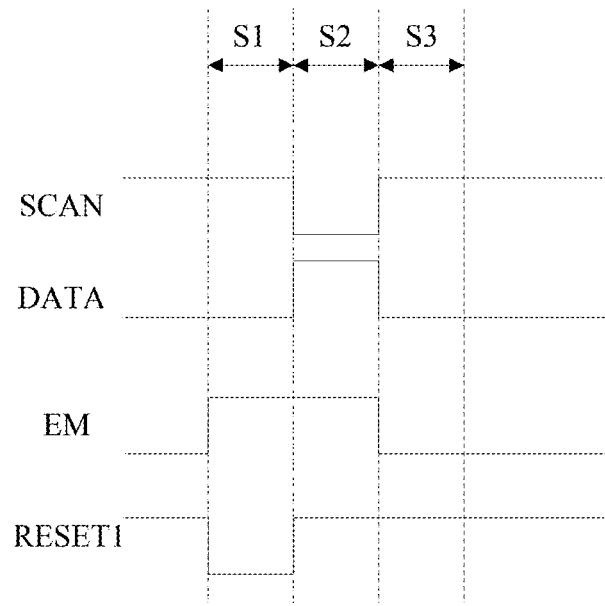
FIG. 3 is a working timing diagram of the pixel circuit provided in FIG. 2.

FIG. 2 is an equivalent circuit diagram of a pixel circuit according to at least one embodiment of the present disclosure. FIG. 3 is a working timing diagram of the pixel circuit provided in FIG. 2.

In some exemplary implementation modes, as shown in FIG. 2, the pixel circuit of this exemplary embodiment may include: six switching transistors (T1, T2, and T4 to T7), a drive transistor T3, and a storage capacitor Cst. The six switching transistors are respectively a data writing transistor T4, a threshold compensation transistor T2, a first light emitting control transistor T5, a second light emitting control transistor T6, a first reset transistor T1, and a second reset transistor T7. A light emitting element EL may include an anode, a cathode, and an organic emitting layer disposed between the anode and the cathode.

In some exemplary implementation modes, the drive transistor and the six switching transistors may be P-type transistors or may be N-type transistors. Adopting a same type of transistors in a pixel circuit may simplify a process flow, reduce a process difficulty of a display substrate, and improve a yield of products. In some exemplary implementation modes, the drive transistor and the six switching transistors may include a P-type transistor and an N-type transistor.

In some exemplary implementation modes, Low Temperature Poly-Silicon thin film transistors, or oxide thin film transistors, or a Low Temperature Poly-Silicon thin film transistor and an oxide thin film transistor may be adopted for the drive transistor and the six switching transistors. An active layer of a Low Temperature Poly-Silicon thin film transistor is made of Low Temperature Poly-Silicon (LTPS), and an active layer of an oxide thin film transistor is made of an oxide semiconductor (Oxide). A Low-temperature Poly-Silicon thin film transistor has advantages such as a high mobility and fast charging, while an oxide thin film transistor has an advantage such as a low leakage current. The Low Temperature Poly-Silicon thin film transistor and the oxide thin film transistor are integrated on one display substrate to form a Low Temperature Polycrystalline Oxide (LTPO) display substrate, and advantages of both the Low Temperature Poly-Silicon thin film transistor and the oxide thin film transistor may be utilized, which may achieve low frequency drive, reduce power consumption, and improve display quality.

In some exemplary implementation modes, as shown in FIG. 2, a pixel circuit is connected with a scan line GL, a data line DL, a first power supply line PL1, a second power supply line PL2, a light emitting control line EML, a first initial signal line INIT1, a second initial signal line INIT2, a first reset control line RST1, and a second reset control line RST2. In some examples, the first power supply line PL1 is configured to provide a constant first voltage signal VDD to a pixel circuit, the second power supply line PL2 is configured to provide a constant second voltage signal VSS to a pixel circuit, and the first voltage signal VDD is greater than the second voltage signal VSS. The scan line GL is configured to provide a scan signal SCAN to the pixel circuit, the data line DL is configured to provide a data signal DATA to the pixel circuit, the light emitting control line EML is configured to provide a light emitting control signal EM to the pixel circuit, the first reset control line RST1 is configured to provide a first reset control signal RESET1 to the pixel circuit, and the second reset control line RST2 is configured to provide a second reset signal RESET2 to the pixel circuit. In some examples, in a row of pixel circuits, the second reset control line RST2 may be connected with the scan line GL to be input with the scan signal SCAN. That is, a second reset signal RESET2(n) received by a pixel circuit of an nth row is a scan signal SCAN (n) received by the pixel circuit of the nth row. However, this embodiment is not limited thereto. For example, the second reset control signal line RST2 may be inputted with a second reset control signal RESET2 different from the scan signal SCAN. In some examples, in a pixel circuit of an nth row, a first reset control line RST1 may be connected with a scan line GL of a pixel circuit of an (n−1)th row to be inputted with a scan signal SCAN(n−1), that is, a first reset control signal RESET1(n) is the same as the scan signal SCAN(n−1). Thus, signal lines of the display substrate may be reduced, and a narrow frame of the display substrate may be achieved.

In some exemplary implementation modes, as shown in FIG. 2, a drive transistor T3 is electrically connected with a light emitting element EL, and outputs a drive current to drive the light emitting element EL to emit light under control of a scan signal SCAN, a data signal DATA, a first voltage signal VDD, a second voltage signal VSS and etc. A gate of a data writing transistor T4 is electrically connected with a scan line GL, a first electrode of the data writing transistor T4 is electrically connected with a data line DL, and a second electrode of the data writing transistor T4 is electrically connected with a first electrode of the drive transistor T3. A threshold compensation transistor T2 is a double-gate transistor, a first gate electrode and a second gate electrode of the threshold compensation transistor T2 is electrically connected with a scan line GL, a first electrode of the threshold compensation transistor T2 is electrically connected with a gate of the drive transistor T3, and a second electrode of the threshold compensation transistor T2 is electrically connected with a second electrode of the drive transistor T3. A gate of a first light emitting control transistor T5 is electrically connected with a light emitting control line EML, a first electrode of the first light emitting control transistor T5 is electrically connected with a first power supply line PL1, and a second electrode of the first light emitting control transistor T5 is electrically connected with the first electrode of the drive transistor T3. A gate of a second light emitting control transistor T6 is electrically connected with the light emitting control line EML, a first electrode of the second light emitting control transistor T6 is electrically connected with the second electrode of the drive transistor T3, and a second electrode of the second light emitting control transistor T6 is electrically connected with an anode of the light emitting element EL. A first reset transistor T1 is electrically connected with the gate of the drive transistor T3 and configured to reset the gate of the drive transistor T3, and a second reset transistor T7 is electrically connected with the anode of the light emitting element EL and configured to reset the anode of the light emitting element EL. A gate of the first reset transistor T1 is electrically connected with a first reset control line RST1, a first electrode of the first reset transistor T1 is electrically connected with a first initial signal line INIT1, and a second electrode of the first reset transistor T1 is electrically connected with the gate of the drive transistor T3. A gate of the second reset transistor T7 is electrically connected with a second reset control line RST2, a first electrode of the second reset transistor T7 is electrically connected with a second initial signal line INIT2, and a second electrode of the second reset transistor T7 is electrically connected with the anode of the light emitting element EL. A first electrode of a storage capacitor Cst is electrically connected with the gate of the drive transistor T3, and a second electrode of the storage capacitor Cst is electrically connected with the first power supply line PL1.

In this example, a first node N1 is a connection point of the storage capacitor Cst, the first reset transistor T1, the drive transistor T3, and the threshold compensation transistor T2, a second node N2 is a connection point of the first light emitting control transistor T5, the data writing transistor T4, and the drive transistor T3, a third node N3 is a connection point of the drive transistor T3, the threshold compensation transistor T2, and the second light emitting control transistor T6, and a fourth node N4 is a connection point of the second light emitting control transistor T6, the second reset transistor T7, and the light emitting element EL.

A working process of the pixel circuit shown in FIG. 2 will be described below with reference to FIG. 3. The description is given by taking a case in which a plurality of transistors included in the pixel circuit shown in FIG. 2 are all P-type transistors as an example.

In some exemplary implementation modes, as shown in FIG. 2 and FIG. 3, during one frame display period, the working process of the pixel circuit may include a first stage S1, a second stage S2, and a third stage S3.

The first stage S1 is referred to as a reset stage. A first reset control signal RESET1 provided by the first reset control line RST1 is a low-level signal, so that the first reset transistor T1 is turned on, and a first initial signal provided by the first initial signal line INIT1 is provided to the first node N1 to initialize the first node N1 and clear an original data voltage in the storage capacitor Cst. A scan signal SCAN provided by the scan line GL is a high-level signal, and a light emitting control signal EM provided by the light emitting control line EML is a high-level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

The second stage S2 is referred to as a data writing stage or a threshold compensation stage. A scan signal SCAN provided by the scan line GL is a low-level signal, a first reset control signal RESET1 provided by the first reset control line RST1 and an emitting control signal EM provided by the emitting control line EML are both high-level signals, and the data line DL outputs a data signal DATA. In this phase, the first electrode of the storage capacitor Cst is at a low level, such that the drive transistor T3 is turned on. The scan signal SCAN is a low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of a first electrode (that is, the first node N1) of the storage capacitor Cst is Vdata−|Vth|, wherein Vdata is the data voltage output by the data line DL, and Vth is the threshold voltage of the drive transistor T3. The second reset transistor T7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. The first reset control signal RESET1 provided by the first reset control line RST1 is a high-level signal, so that the first reset transistor T1 is turned off. The light emitting control signal EM provided by the light emitting control signal line EML is a high-level signal, so that the first light emitting control transistor T5 and the second light emitting control transistor T6 are turned off.

The third stage S3 is referred to as a light emitting stage. A light emitting control signal EM provided by the light emitting control signal line EML is a low-level signal, and a scan signal SCAN provided by the scan line GL and a first reset control signal RESET1 provided by the first reset control line RST1 are high-level signals. The light emitting control signal EM provided by the light emitting control signal line EML is a low-level signal, so that the first light emitting control transistor T5 and the second light emitting control transistor T6 are turned on, and a first voltage signal VDD output by the first power supply line PL1 provides a drive voltage to an anode of the light emitting element EL through the turned-on first light emitting control transistor T5, the drive transistor T3, and the second light emitting control transistor T6 to drive the light emitting element EL to emit light.

In a drive process of a pixel circuit, a drive current flowing through the drive transistor T3 is determined by a voltage difference between the gate electrode and the first electrode of the drive transistor T3. Because the voltage of the first node N1 is Vdata-|Vth|, the drive current of the drive transistor T3 is as follows.

$$I = K \times (Vgs - Vth)^2 =$$
$$K \times [(VDD - Vdata + |Vth|) - Vth]^2 = K \times [VDD - Vdata]^2$$

Among them, I is the drive current flowing through the drive transistor T3, that is, the drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light emitting element EL has nothing to do with the threshold voltage of the drive transistor T3. Therefore, the pixel circuit of this embodiment may better compensate the threshold voltage of the drive transistor T3.

Figure 4:
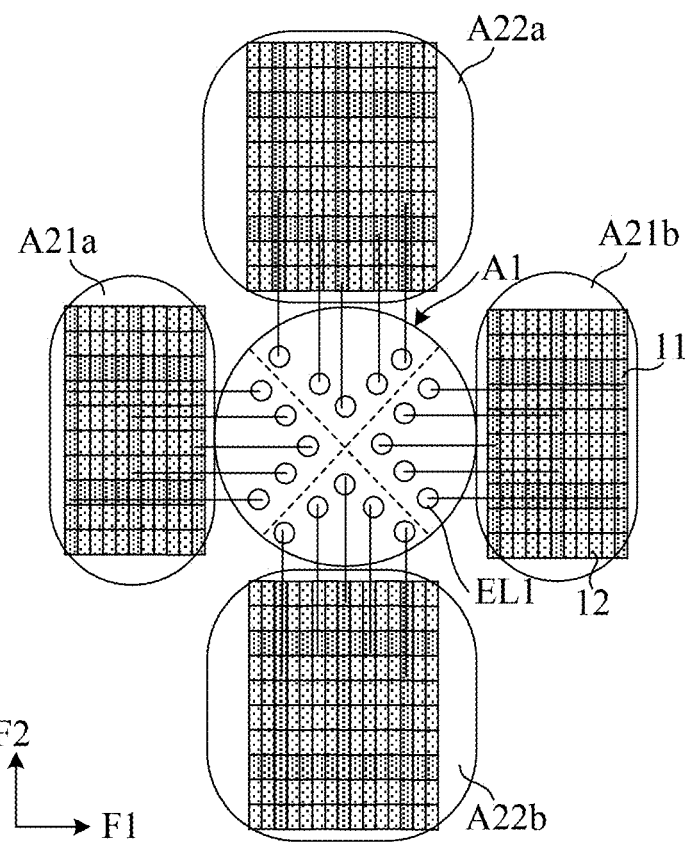
FIG. 4 is a partial schematic diagram of a display region of a display substrate according to at least one embodiment of the present disclosure.

FIG. 4 is a partial schematic diagram of a display region of a display substrate according to at least one embodiment of the present disclosure. In some exemplary implementation modes, as shown in FIGS. 1 and 4, a first display region A1 includes two first sub-display regions A11a and A12a sequentially arranged along a first direction F1, and two second sub-display regions A12a and A12b sequentially arranged along a second direction F2. The first direction F1 intersects the second direction F2, for example, the first direction F1 is perpendicular to the second direction F2. A second display region A2 includes: a third sub-display region A21a adjacent to the first sub-display region A11a in the first direction F1, a third sub-display region A21b adjacent to the first sub-display region A11b in the first direction F1, a fourth sub-display region A22a adjacent to the second sub-display region A12a in the second direction F2, a fourth sub-display region A22b adjacent to the second sub-display region A12b in the second direction F2, and a fifth sub-display region A23. The fifth sub-display region A23 is a region in the second display region A2 other than the third sub-display regions A21a and A21b and the fourth sub-display regions A22a and A22b. The third sub-display region A21a faces the first sub-display region A11a in the first direction F1, and the third sub-display region A21b faces the first sub-display region A11b in the first direction F1; the fourth sub-display region A22a faces the second sub-display region A12a in the second direction F2, and the fourth sub-display region A22b faces the second sub-display region A12b in the second direction F2.

In this example, as shown in FIGS. 1 and 4, the first display region A1 may be divided into four sub-display regions along a center line of a third direction F3 and a center line of a fourth direction F4, namely two first sub-display regions A11a and A11b and two second sub-display regions A12a and A12b. The third direction F3 intersects with both of the first direction F1 and the second direction F2, and the fourth direction F4 may be perpendicular to the third direction F3. However, this embodiment is not limited thereto. For example, the first display region A1 may be divided into four sub-display regions along a center line of the first direction F1 and a center line of the second direction F2 (for example, two first sub-display regions sequentially arranged along a third direction and two second sub-display regions sequentially arranged along a fourth direction), a third sub-display region of the second display region A2 may be adjacent to a first sub-display region in the third direction, and a fourth sub-display region may be adjacent to a second sub-display region in the fourth direction.

In some exemplary implementation modes, as shown in FIG. 1, the first display region A1 may be circular, and the two first sub-display regions A11a and A11b and the two second sub-display regions A12a and A12b may be fan-shaped with a same size. Two third sub-display regions A21a and A21b and two fourth sub-display regions A22a and A22b may both be circular. However, this embodiment is not limited thereto. For example, sizes of the two first sub-display regions and the two second sub-display regions may be different. For another example, the first display region may be rectangular, a first sub-display region and a second sub-display region may be rectangular, and a third sub-display region and a fourth sub-display region may be rectangular.

In some exemplary implementation modes, as shown in FIG. 1 and FIG. 4, the first display region A1 is provided with a plurality of first light emitting elements EL1. The second display region A2 is provided with a plurality of second light emitting elements and a plurality of pixel circuits. The plurality of pixel circuits of the second display region A2 may include a plurality of first pixel circuits 11 and a plurality of second pixel circuits 12. At least one first pixel circuit 11 of the second display region A2 is electrically connected with at least one first light emitting element EL1 of the first display region A1. For example, a first light emitting element EL1 of the first display region A1 and a first pixel circuit 11 of the second display region A2 may be in a one-to-one or many-to-one relationship, in other words, one first pixel circuit 11 of the second display region A2 may be configured to drive one or more first light emitting elements EL1 in the first display region A1 to emit light. At least one second pixel circuit 12 of the second display region A2 is electrically connected with at least one second light emitting element. For example, a plurality of second pixel circuits 12 of the second display region A2 and a plurality of second light emitting elements may be in a one-to-one correspondence relationship, in other words, one second pixel circuit 12 in the second display region A2 may be configured to drive one second light emitting element to emit light. However, this embodiment is not limited thereto.

In some exemplary implementation modes, as shown in FIGS. 1 and 4, a first light emitting element EL1 in a first sub-display region A11a of the first display region A1 may be electrically connected with a first pixel circuit 11 in a third sub-display region A21a of the second display region A2 through a first transparent conductive line L1. A first light emitting element EL1 in a first sub-display region A11b of the first display region A1 may be electrically connected with a first pixel circuit 11 in a third sub-display region A21b of the second display region A2 through a first transparent conductive line L1. A first light emitting element EL1 in a second sub-display region A12a of the first display region A1 may be electrically connected with a first pixel circuit 11 in a fourth sub-display region A22a of the second display region A2 through a second transparent conductive line L2. A first light emitting element EL1 in a second sub-display region A12b of the first display region A1 may be electrically connected with a first pixel circuit 11 in a fourth sub-display region A22b of the second display region A2 through a second transparent conductive line L2. Among them, a first transparent conductive line L1 and a second transparent conductive line L2 may be made of transparent conductive materials. In this way, a light transmission rate of the first display region A1 may be improved. In this example, the first transparent conductive line L1 may extend substantially along a first direction F1 and the second transparent conductive line L2 may extend substantially along a second direction F2. In some examples, the first transparent conductive line L1 may be a single-layer wiring or a multi-layer wiring (i.e., formed by wirings of different film layers in series or in parallel), and the second transparent conductive line L2 may be a single-layer wiring or a multi-layer wiring. For example, a first transparent conductive line and a second transparent conductive line electrically connected with first light emitting elements of a same color may be of a same layer structure, first transparent conductive lines electrically connected with first light emitting elements of different colors may be located in different film layers, and second transparent conductive lines electrically connected with second light emitting elements of different colors may be located in different film layers. However, this embodiment is not limited thereto.

In some exemplary implementation modes, as shown in FIGS. 1 and 4, a first light emitting element EL1 in a first sub-display region A11a and a first pixel circuit 11 in a third sub-display region A21a are taken as examples, a first light emitting element EL1 in the first sub-display region A11a close to the third sub-display region A21a is electrically connected with a first pixel circuit 11 in the third sub-display region A21a away from the first sub-display region A11a; a first light emitting element EL1 in the first sub-display region A11a away from the third sub-display region A21a is electrically connected with a first pixel circuit 11 in the third sub-display region A21a close to the first sub-display region A11a. Lengths of a plurality of first transparent conductive lines L1 connecting different first light emitting elements EL1 and first pixel circuits 11 may be substantially the same. Similarly, in the second direction F2, lengths of a plurality of second transparent conductive lines L2 connecting different first light emitting elements EL1 and first pixel circuits 11 may be substantially the same. In some examples, length ranges of the first transparent conductive line L1 and the second transparent conductive line L2 may be substantially the same. In this way, a maximum length of a transparent conductive line may be reduced as a whole, and a difference of a wiring length of the transparent conductive line may be reduced, so that a display screen presents better uniformity.

In this example, by setting first light emitting elements of the first display region to be electrically connected with first pixel circuits arranged in two different directions (i.e., a first direction F1 and a second direction F2), it is beneficial to reduce maximum wiring lengths of a first transparent conductive line and a second transparent conductive line, a size limitation on the first display region may be also improved, and it is beneficial to increase a size of the first display region.

In some exemplary implementation modes, first pixel circuits 11 and second pixel circuits of the second display region may be alternately arranged along the first direction F1 and the second direction F2. In this example, a plurality of pixel circuits arranged along the first direction F1 sequentially may be referred to as a row of pixel circuits, and a plurality of pixel circuits arranged along the second direction F2 sequentially may be referred to as a column of pixel circuits.

In some exemplary implementation modes, as shown in FIG. 4, at least one first pixel circuit 11 is disposed between a plurality of second pixel circuits 12 arranged along the first direction F1, and at least one first pixel circuit 11 is disposed between a plurality of second pixel circuits 12 arranged along the second direction F2. First pixel circuits 11 may be arranged between a plurality of rows and a plurality of columns of second pixel circuits 12. For example, in the first direction F1, four columns of second pixel circuits 12 and one column of first pixel circuits 11 are alternately arranged, and in the second direction F2, four rows of second pixel circuits 12 and one row of first pixel circuits 11 are alternately arranged. In other words, one row of first pixel circuits 11 is disposed between every four rows of second pixel circuits 12 and one column of first pixel circuits 11 is disposed between every four columns of second pixel circuits 12. Compared with the second display region in which only second pixel circuits are provided, in this example, arrangement space of one column of first pixel circuits 11 may be newly added by compressing original every four columns of second pixel circuits along the first direction F1, and arrangement space of one row of first pixel circuits 11 may be newly added by compressing original every four rows of second pixel circuits along the second direction F2. For example, after a plurality of pixel circuits originally arranged in a 4*4 array are compressed along the first direction F1 and the second direction F2, a plurality of pixel circuits of a 5*5 array arrangement may be obtained (for example, including compressed second pixel circuits of 4*4 array arrangement and a row of first pixel circuit and a column of first pixel circuit that are newly added), and pixel circuits of the 4*4 array arrangement before compression and pixel circuits of the 5*5 array arrangement after compression occupy same space. However, this embodiment is not limited thereto.

In some exemplary implementation modes, second pixel circuits and first pixel circuits may be arranged according to a same rule in the second display region A2 for display uniformity. First pixel circuits in a third sub-display region and a fourth sub-display region of the second display region A2 are electrically connected with first light emitting elements in the first display region, and a first pixel circuit in a fifth sub-display region A23 is not electrically connected with a first light emitting element of the first display region. In other words, the first pixel circuit of the fifth sub-display region A23 may be used as a Dummy pixel circuit. However, this embodiment is not limited thereto. For example, first pixel circuits may be added only in the third sub-display region and the fourth sub-display region by compressing second pixel circuits and the fifth sub-display region may not be added with a first pixel circuit.

Figure 5:
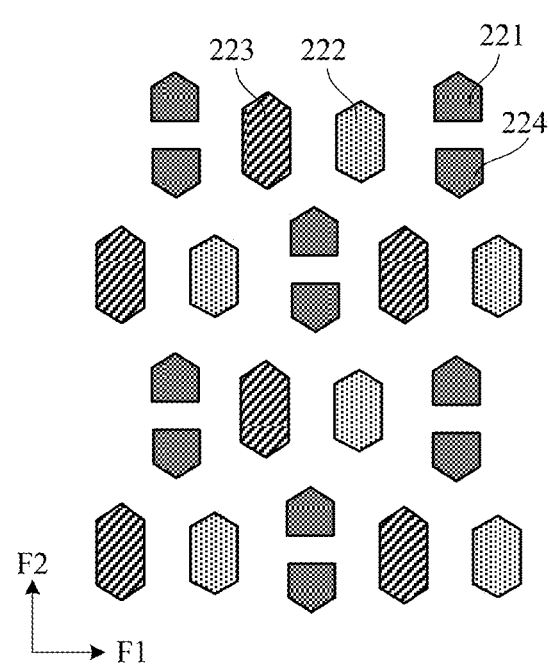
FIG. 5 is a schematic diagram of an arrangement of second light emitting elements in a second display region according to at least one embodiment of the present disclosure.

FIG. 5 is a schematic diagram of an arrangement of second light emitting elements in a second display region according to at least one embodiment of the present disclosure. In some exemplary implementation modes, as shown in FIG. 5, a plurality of second light emitting elements 40 in the second display region A2 may include: a plurality of green second light emitting elements 221 and 224, a plurality of red second light emitting elements 222, and a plurality of blue second light emitting elements 223. At least one pixel unit of the second display region A2 may include: one blue second light emitting element 223, two green second light emitting elements 221 and 224, and one red second light emitting element 222. The green second light emitting elements 221 and 224 are sequentially arranged in the second direction F2, and the red second light emitting element 222 and the blue second light emitting element 223 are sequentially arranged in the first direction F1. Second light emitting elements of a same color of adjacent rows are dislocated in the first direction F1.

In some exemplary implementation modes, a plurality of first light emitting elements of the first display region A1 may include: a plurality of green first light emitting elements, a plurality of red first light emitting elements, and a plurality of blue first light emitting elements. An arrangement of the plurality of first light emitting elements in the first display region A1 and an arrangement of the plurality of second light emitting elements in the second display region A2 may be consistent, so details will not be repeated here.

In some exemplary implementation modes, at least one light emitting element of the display region AA may include: an anode, a cathode, and an organic emitting layer disposed between the anode and the cathode. As shown in FIG. 5, orthographic projections of anodes of the green second light emitting elements 221 and 224 of the second display region A2 on the base substrate may be pentagonal, and orthographic projections of anodes of the red second light emitting element 222 and the blue third light emitting element 223 on the base substrate may be hexagonal. An area of an anode of a first light emitting element of the first display region A1 may be smaller than an area of an anode of a second light emitting element of the second display region A2 that emits light of a same color. For example, an orthographic projection of an anode of a green first light emitting element of the first display region on the base substrate may be circular, and orthographic projections of anodes of a red first light emitting element and a blue first light emitting element on the base substrate may be elliptical. For example, the ellipse may be a combined shape of a square and two semicircles, wherein the two semicircles are connected at opposite ends of the square. In this example, by performing a corner smoothing design on an anode of a first light emitting element of the first display region, diffraction of a camera below the first display region of the display substrate during shooting may be reduced, thereby improving a shooting effect. However, this embodiment is not limited thereto.

Figure 6:
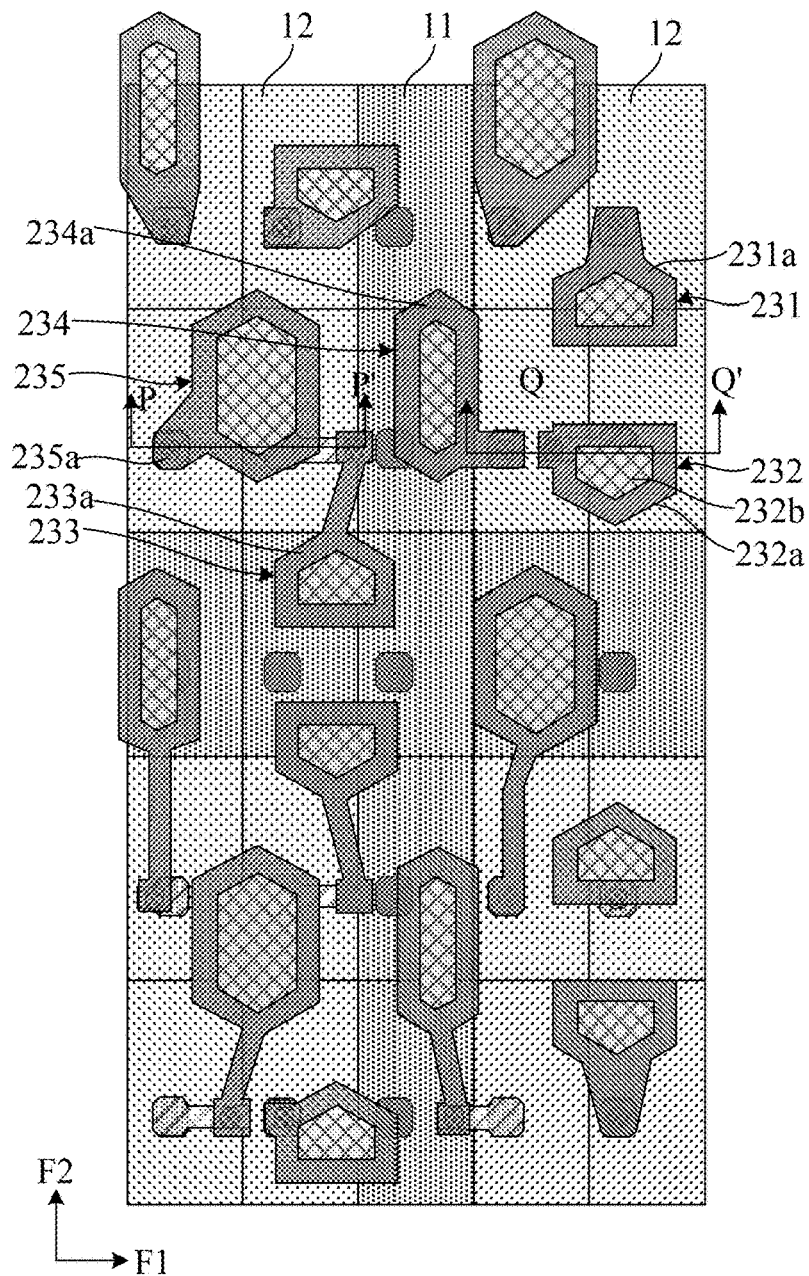
FIG. 6 is a partial plan view of a third sub-display region of a second display region in FIG. 1.
Figure 7A:
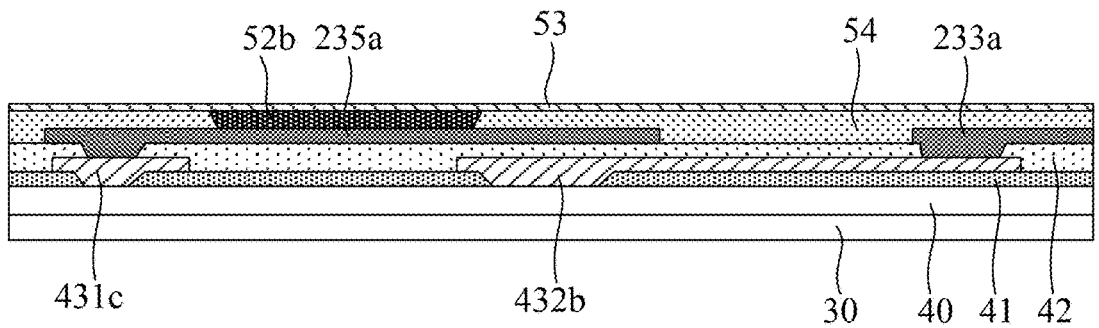
FIG. 7A is a partial sectional view along a P-P' direction in FIG. 6.
Figure 7B:
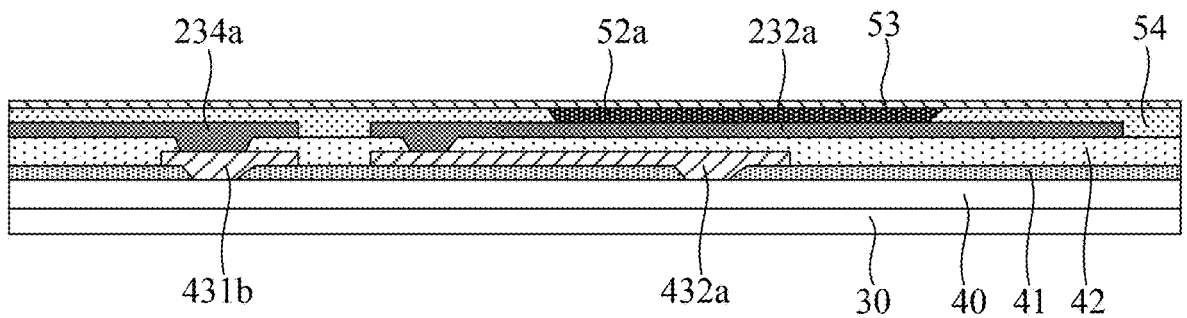
FIG. 7B is a partial sectional view along a Q-Q' direction in FIG. 6.
Figure 8:
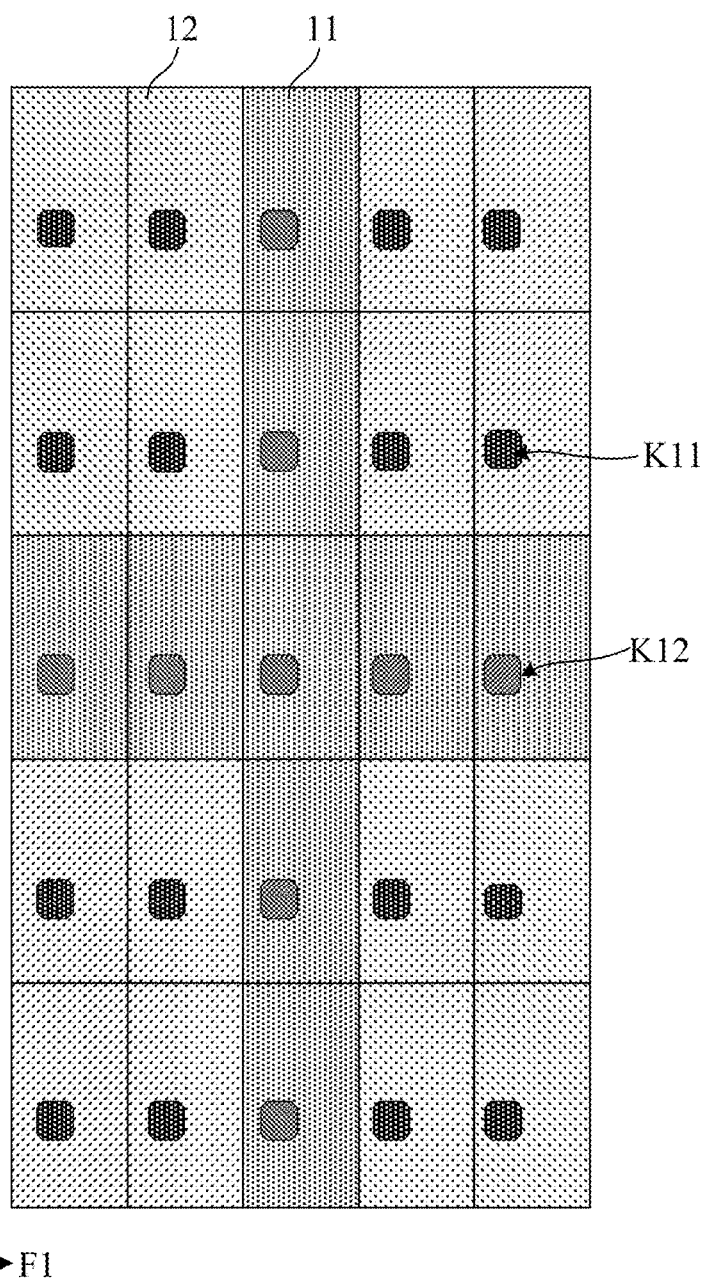
FIG. 8 is a partial plan view of a third sub-display region after a first planarization layer is formed in FIG. 6.
Figure 9:
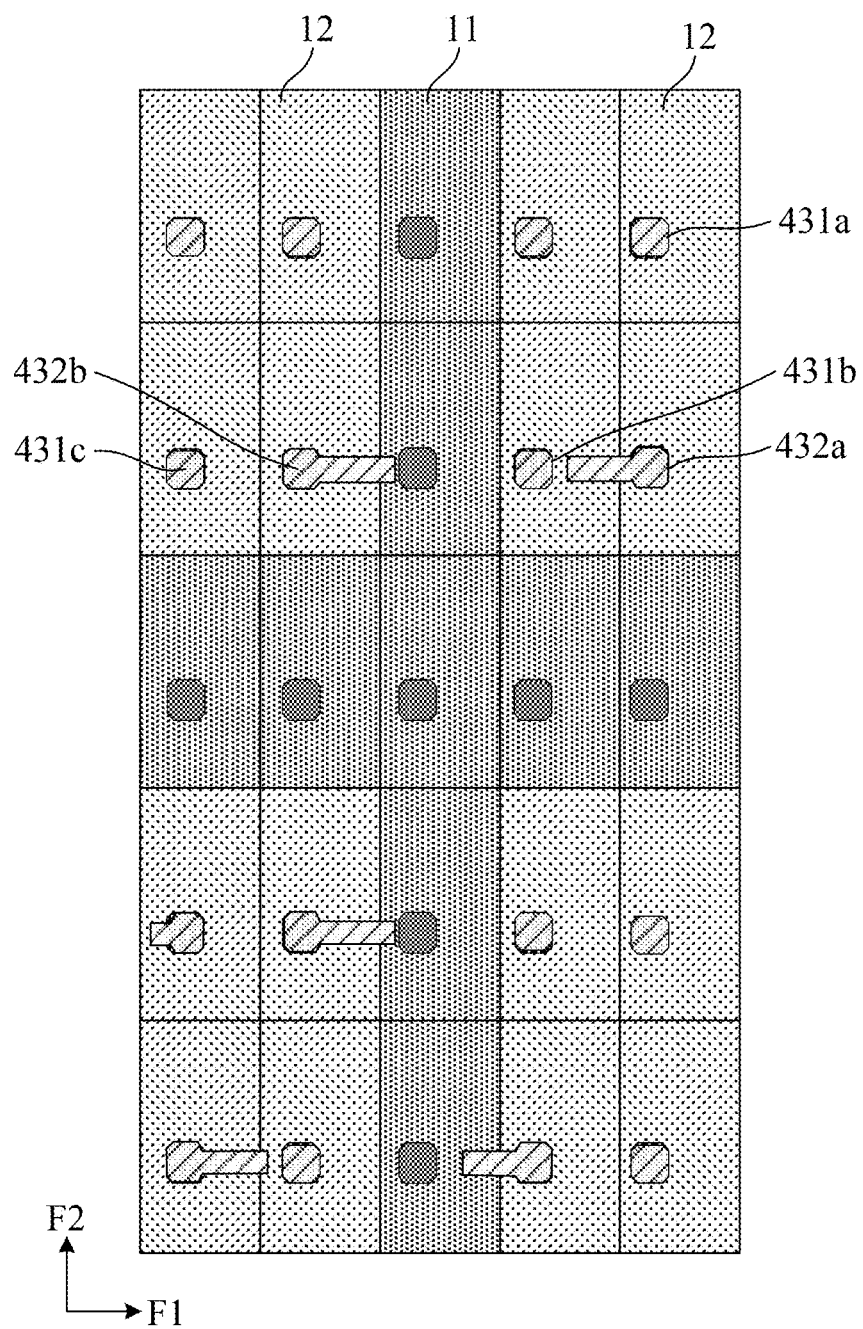
FIG. 9 is a partial plan view of a third sub-display region after an electrical connection layer is formed in FIG. 6.
Figure 10:
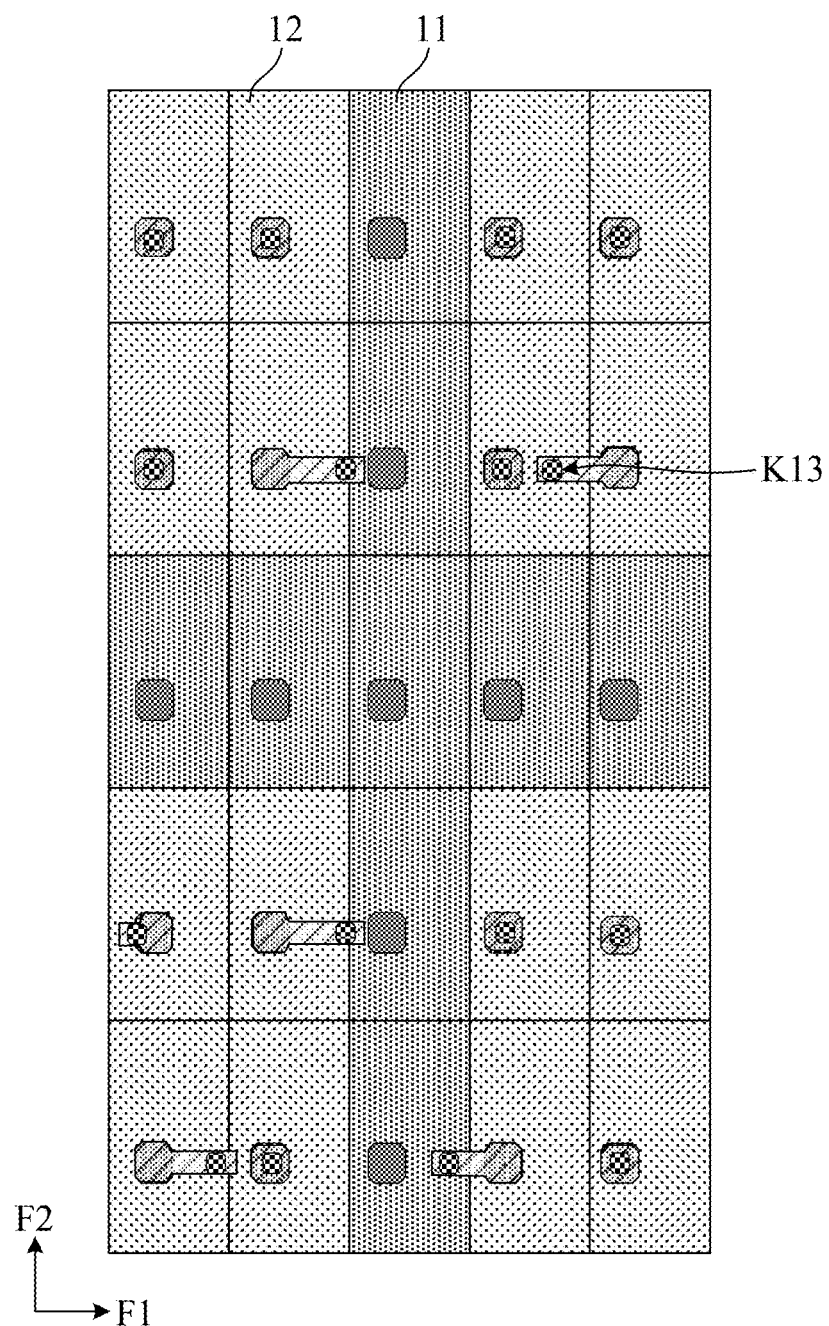
FIG. 10 is a partial plan view of a third sub-display region after a second planarization layer is formed in FIG. 6.
Figure 11:
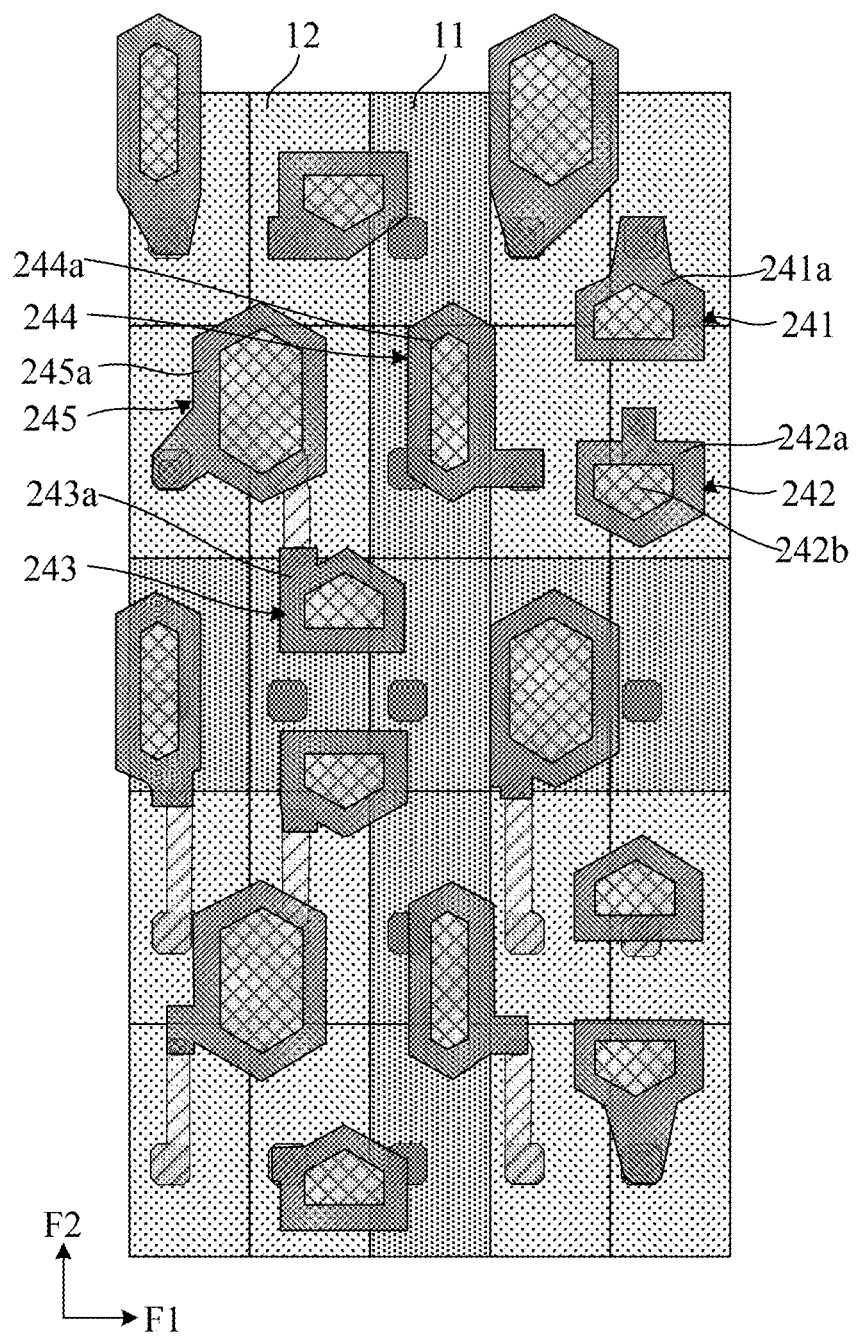
FIG. 11 is a partial plan view of a fourth sub-display region of the second display region in FIG. 1.
Figure 12:
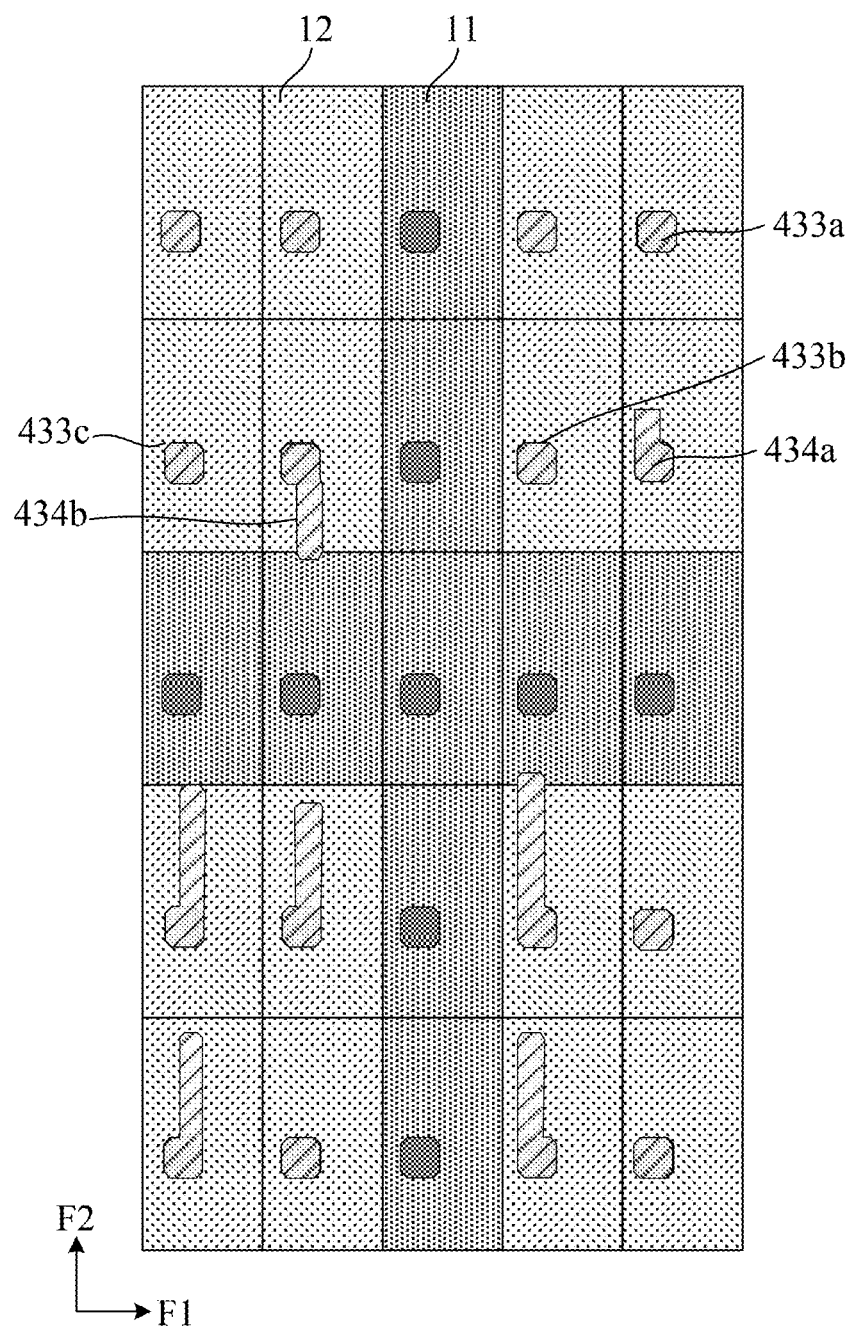
FIG. 12 is a partial plan view of a fourth sub-display region after an electrical connection layer is formed in FIG. 11.
Figure 13:
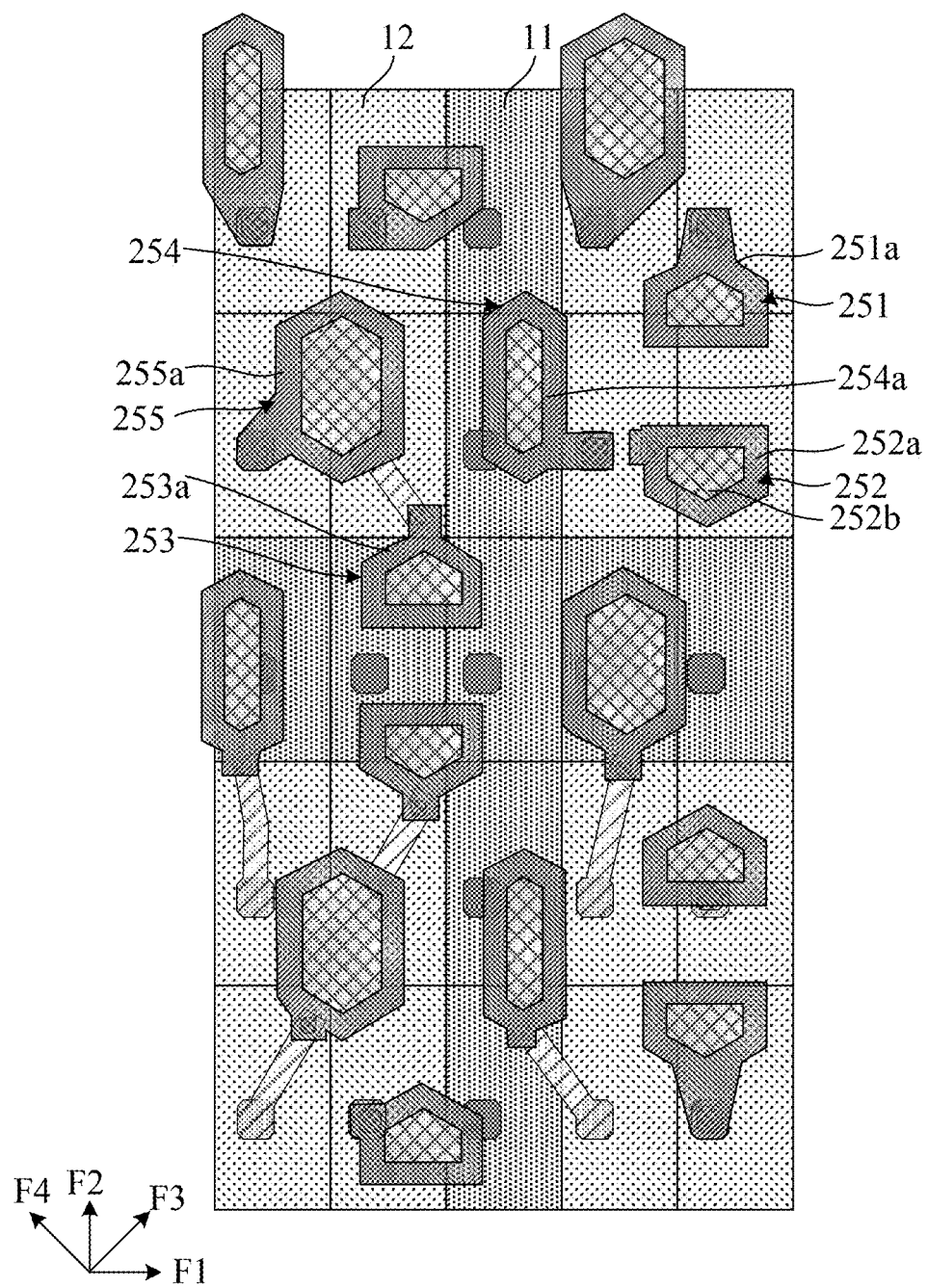
FIG. 13 is a partial plan view of a fifth sub-display region of the second display region in FIG. 1.
Figure 14:
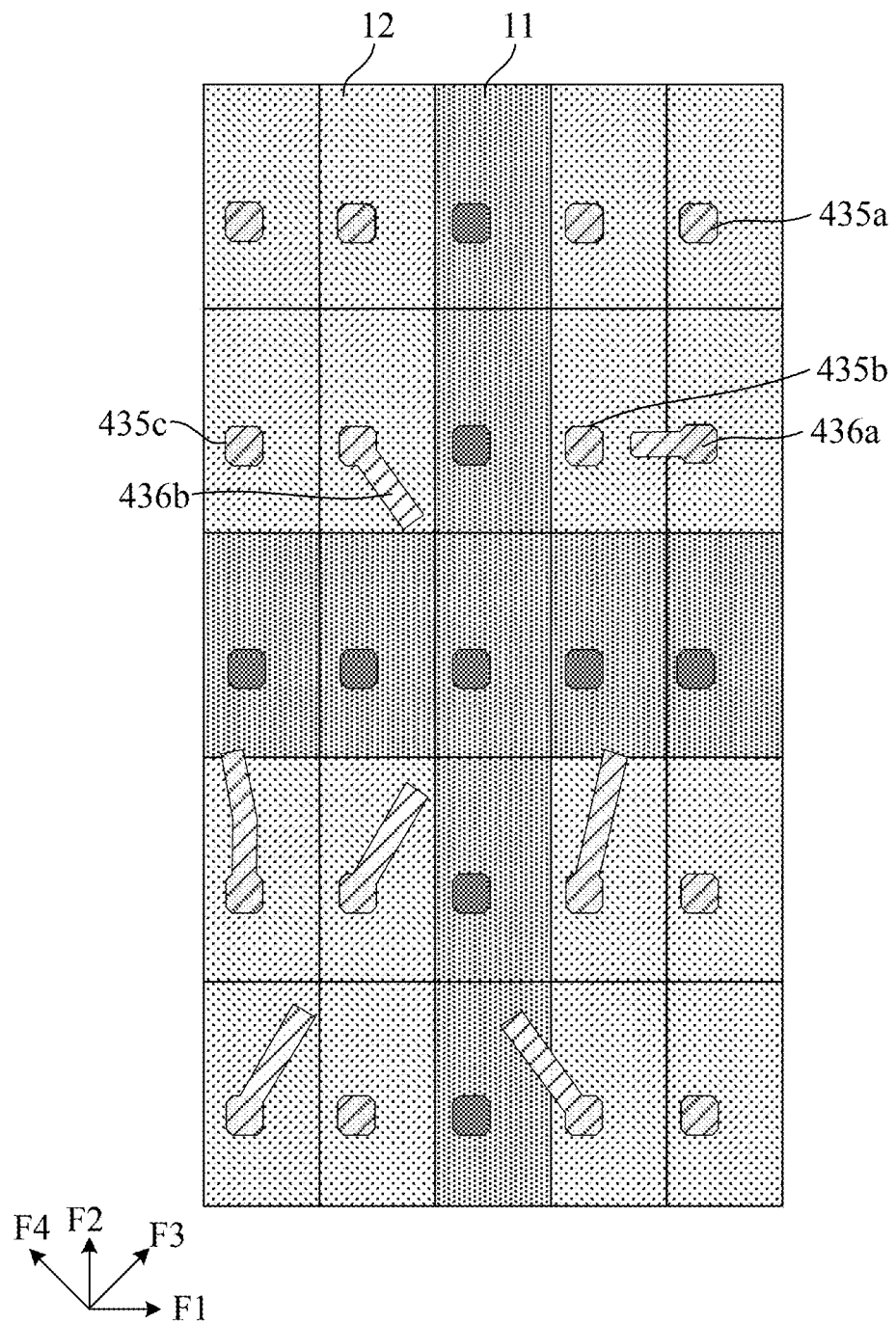
FIG. 14 is a partial plan view of a fifth sub-display region after an electrical connection layer is formed in FIG. 11.

FIG. 6 is a partial plan view of a third sub-display region of a second display region in FIG. 1. FIG. 7A is a partial sectional view along a P-P' direction in FIG. 6. FIG. 7B is a partial sectional view along a Q-Q' direction in FIG. 6. FIG. 8 is a partial plan view of a third sub-display region after a first planarization layer is formed in FIG. 6. FIG. 9 is a partial plan view of a third sub-display region after an electrical connection layer is formed in FIG. 6. FIG. 10 is a partial plan view of a third sub-display region after a second planarization layer is formed in FIG. 6. FIG. 11 is a partial plan view of a fourth sub-display region of the second display region in FIG. 1. FIG. 12 is a partial plan view of a fourth sub-display region after an electrical connection layer is formed in FIG. 11. FIG. 13 is a partial plan view of a fifth sub-display region of the second display region in FIG. 1. FIG. 14 is a partial plan view of a fifth sub-display region after an electrical connection layer is formed in FIG. 11.

In some exemplary implementation modes, as shown in FIGS. 6, 11, and 13, because a first pixel circuit 11 is added between second pixel circuits 12, a quantity of rows of pixel circuit of the second display region A2 is greater than a quantity of rows of second light emitting elements, a quantity of columns is greater than a quantity of columns of second light emitting elements, resulting in dislocation between second pixel circuits and second light emitting elements electrically connected to the second pixel circuits, and directly electrically connecting the second pixel circuits with anodes of the second light emitting elements will lead to short circuit of adjacent second light emitting elements and loss of aperture ratio.

In some exemplary implementation modes, as shown in FIGS. 7A and 7B, in a direction perpendicular to a display substrate, a second display region A2 may include: a base substrate 30, and a pixel circuit layer 40, a first planarization layer 41, an electrical connection layer, a second planarization layer 42, and a light emitting structure layer that are sequentially disposed on the base substrate 30. The pixel circuit layer 40 may include a plurality of first pixel circuits 11 and a plurality of second pixel circuits 12. The electrical connection layer may include a plurality of connection electrodes (e.g., connection electrode 431b), a plurality of adapter lines (e.g., including first adapter lines and second adapter lines), a plurality of first transparent conductive lines, and a plurality of second transparent conductive lines. The light emitting structure layer may include an anode layer (e.g. the anode layer includes anodes of a plurality of second light emitting elements), a pixel definition layer 54, an organic emitting layers (e.g. organic emitting layers 52a and 52b) and a cathode layer 53. An organic emitting layer of at least one second light emitting element is sandwiched between an anode and a cathode. Cathodes of the plurality of second light emitting elements may be of an integral structure.

In some examples, a plurality of second light emitting elements of the second display region A2 may include a second sub-light emitting element and a third sub-light emitting element. The second sub-light emitting element is electrically connected with a second pixel circuit through a first adapter hole, and an orthographic projection of the first adapter hole on the base substrate is overlapped with an orthographic projection of the third sub-light emitting element on the base substrate. Among them, the second sub-light emitting element and the third sub-light emitting element may be disposed adjacent to each other. However, this embodiment is not limited thereto. For example, the second sub-light emitting element and the third sub-light emitting element may not be disposed adjacent to each other.

In some examples, the plurality of second light emitting elements of the second display region A2 may further include a fourth sub-light emitting element. The fourth sub-light emitting element is electrically connected with a second pixel circuit through a first adapter hole, and an orthographic projection of the first adapter hole on the base substrate is overlapped with an orthographic projection of a light emitting region of the fourth sub-light emitting element on the base substrate.

With reference to FIGS. 6 to 10, a structure of the third sub-display region will be described by taking green second light emitting elements 231 to 233, a red second light emitting element 234, and a blue second light emitting element 235 in FIG. 6 as examples. Among them, a green second light emitting element 233 is taken as an example of a second sub-light emitting element, the blue second light emitting element 235 is taken as an example of a third sub-light emitting element, and a green second light emitting element 232 is taken as an example of a fourth sub-light emitting element.

In some exemplary implementation modes, as shown in FIGS. 6 to 8, a plurality of first adapter holes K11 and a plurality of second adapter holes K12 are provided on the first planarization layer 41 covering the pixel circuit layer. The first planarization layer 41 in a first adapter hole K11 and a second adapter hole K12 is removed, the second adapter hole K12 may expose an anode connection terminal of a first pixel circuit 11, and the first adapter hole K11 may expose an anode connection terminal of a second pixel circuit 12. As shown in FIG. 8, first adapter holes K11 and second adapter holes K12 in a same row are sequentially arranged along a first direction F1, and first adapter holes K11 and second adapter holes K12 in a same column are sequentially arranged along a second direction F2. However, this embodiment is not limited thereto.

In some exemplary implementation modes, as shown in FIGS. 6 to 9, an electrical connection layer of a third sub-display region of the second display region A2 may include a plurality of connection electrodes (e.g., connection electrodes 431a to 431c), and a plurality of adapter lines (e.g., a second adapter line 432a and a first adapter line 432b). Each connection electrode may be electrically connected with an anode connection terminal of a second pixel circuit 12 through a first adapter hole K11, and each adapter line may be electrically connected with an anode connection terminal of a second pixel circuit 12 through a first adapter hole K11. A first adapter line and a second adapter line in the third sub-display region may both extend along a first direction F1. A first transparent conductive line electrically connected with an anode connection terminal of a first pixel circuit 11 through a second adapter hole K12 is omitted in FIG. 9. The first transparent conductive line may extend substantially along the first direction F1 to the first display region A1 to achieve an electrical connection between the first pixel circuit 11 and a first light emitting element. In the third sub-display region, a connection position of an anode of a second light emitting element and a second pixel circuit may be changed by arranging a first adapter line and a second adapter line extending along the first direction F1, thereby remaining more space gap for an arrangement of first transparent conductive lines.

In some exemplary implementation modes, as shown in FIG. 10, a plurality of third adapter holes K13 are provided on the second planarization layer 42 covering the electrical connection layer. The second planarization layer 42 in the third adapter holes K13 is removed to expose a surface of the electrical connection layer.

In some exemplary implementation modes, as shown in FIGS. 6 to 10, an anode 232a of a green second light emitting element 232 is electrically connected with a second adapter line 432a through a third adapter hole K13, and the second adapter line 432a is electrically connected with an anode connection terminal of a corresponding second pixel circuit 12 through a first adapter hole K11. Because an orthographic projection of a light emitting region 232b of the green second light emitting element 232 on the base substrate 30 is overlapped with an orthographic projection of the first adapter hole K11 on the base substrate 30, if the anode 232a of the green second light emitting element 232 is electrically connected directly with the anode connection terminal of the second pixel circuit 12 through the first adapter hole K11, film layer flatness of the light emitting region 232b of the green second light emitting element 232 will be affected adversely, thereby causing loss of an aperture ratio of the green second light emitting element 232 and affecting a display effect. In this example, an orthographic projection of a connection position (i.e., the first adapter hole K11) of the second adapter line 432a and the anode connection terminal of the second pixel circuit 12 on the base substrate 30 is overlapped with an orthographic projection of the light emitting region 232b of the second light emitting element 232 on the base substrate 30, and an orthographic projection of a connection position of the second adapter line 432a and the second light emitting element 232 (i.e., the third adapter hole K13) on the base substrate 30 is not overlapped with an orthographic projection of the light emitting region 232b of the second light emitting element 232 on the base substrate 30. Orthographic projections of the first adapter hole K11 and the third adapter hole K13 with which the second adapter line 432a is connected on the base substrate 30 are not overlapped. In this example, a connection position of the anode 232a of the green second light emitting element 232 is transferred to a region other than the light emitting region 232b through the second adapter line 432a extending along the first direction F1 (that is, an orthographic projection of the light emitting region 232b of the green second light emitting element 232 on the base substrate 30 is not overlapped with an orthographic projection of the third adapter hole K13 electrically connected with the anode 232a on the base substrate 30), a film layer flattening processing is performed on the second planarization layer 42, then film layer flatness of the light emitting region 232b may be ensured so as to ensure an aperture ratio of the green second light emitting element 232 and a display effect.

In some exemplary implementation modes, as shown in FIGS. 6 to 10, an anode 233a of the green second light emitting element 233 may be electrically connected with the first adapter line 432b through a third adapter hole K13, and the first adapter line 432b may be electrically connected with an anode connection terminal of a corresponding second pixel circuit 12 through a first adapter hole K11. Because an orthographic projection of a first adapter hole K11 corresponding to the green second light emitting element 233 on the base substrate 30 is overlapped with an orthographic projection of an anode 235a of the blue second light emitting element 235 on the base substrate 30, if the anode 233a of the green second light emitting element 233 is electrically connected directly with the anode connection terminal of the second pixel circuit 12 through the first adapter hole K11, there is a case of short circuit of the anode 233a of the green second light emitting element 233 and the anode 235a of the blue second light emitting element 235, which may cause poor display. In this example, a connection position of the anode 233a of the green second light emitting element 233 is moved to a region other than the anode 235a of the blue second light emitting element 235 (for example, the connection position is moved to a side close to the red second light emitting element 234) through the first adapter line 432b extending along the first direction F1, so that the anode 233a of the green second light emitting element 233 is electrically connected with a second pixel circuit 12. In this example, an orthographic projection of a connection position (i.e., a first adapter hole K11) of the first adapter line 432b and an anode connection terminal of a second pixel circuit 12 on the base substrate 30 is overlapped with an orthographic projection of the anode 235a of the second light emitting element 235 on the base substrate 30, and an orthographic projection of a connection position (i.e., the third adapter hole K13) of the first adapter line 432b and the second light emitting element 233 on the base substrate 30 is not overlapped with an orthographic projection of the anode 235a of the second light emitting element 235 on the base substrate 30. Orthographic projections of the first adapter hole K11 and the third adapter hole K13 with which the first adapter line 432b is connected on the base substrate 30 are not overlapped. In this example, an orthographic projection of the anode 235a of the blue second light emitting element 235 on the base substrate 30 is not overlapped with an orthographic projection of the anode 233a of the green second light emitting element 233 on the base substrate 30, so that a case of short circuit of adjacent second light emitting elements may be avoided, thereby ensuring a display effect.

In some exemplary implementation modes, as shown in FIGS. 6 to 10, an anode 231a of the green second light emitting element 231 may be electrically connected with a corresponding second pixel circuit 12 via a first adapter hole K11 through a connection electrode 431a, an anode 234a of the red second light emitting element 234 may be electrically connected with a corresponding second pixel circuit 12 via a first adapter hole K11 through a connection electrode 431b, and the anode 235a of the blue second light emitting element 235 may be electrically connected with a corresponding second pixel circuit 12 via a first adapter hole K11 through a connection electrode 431c.

In this example, a light emitting region may refer to an opening region of an anode exposed by a pixel definition layer, i.e., an overlapping region of an anode, an organic emitting layer, and a cathode of a light emitting element.

In this exemplary implementation mode, in a third sub-display region, a second pixel circuit and a second sub-light emitting element that are dislocated may be electrically connected through a first adapter line, and the first adapter line extends along a first direction, so that an anode of a second sub-light emitting element may be electrically connected with a corresponding second pixel circuit, and a risk of short circuit of the second sub-light emitting element and a third sub-light emitting element may be avoided. A second pixel circuit and a fourth sub-light emitting element that are dislocated may be electrically connected through a second adapter line, and the second adapter line extends along the first direction, thereby improving a case of aperture ratio loss of the second sub-light emitting element. Moreover, by arranging the first adapter line and the second adapter line both extending along the first direction, arrangement space may be provided for a first transparent conductive line electrically connecting a first pixel circuit and a first light emitting element, thereby avoiding an influence on an arrangement of first transparent conductive lines.

With reference to FIGS. 11 and 12, a structure of the fourth sub-display region will be described by taking green second light emitting elements 241 to 243, a red second light emitting element 244, and a blue second light emitting element 245 in FIG. 11 as examples. Among them, a green second light emitting element 243 is taken as an example of a second sub-light emitting element, the blue second light emitting element 245 is taken as an example of a third sub-light emitting element, and a green second light emitting element 242 is taken as an example of a fourth sub-light emitting element.

In some exemplary implementation modes, as shown in FIGS. 11 and 12, an electrical connection layer of a fourth sub-display region of a second display region A2 may include a plurality of connection electrodes (e.g., connection electrodes 431a to 433c), and a plurality of adapter lines (e.g., a second adapter line 434a and a first adapter line 434b). Each connection electrode may be electrically connected with an anode connection terminal of a second pixel circuit 12 through a first adapter hole K11. Each adapter line may be electrically connected with an anode connection terminal of a second pixel circuit 12 through a first adapter hole K11. A first adapter line and a second adapter line in the fourth sub-display region may both extend along a second direction F2. A second transparent conductive line electrically connected with a second adapter hole is omitted in FIGS. 11 and 12. The second transparent conductive line may extend substantially along the second direction F2 to a first display region to achieve an electrical connection between a first pixel circuit and a first light emitting element. In the fourth sub-display region, a connection position of an anode of a second light emitting element and a second pixel circuit may be changed by arranging a first adapter line and a second adapter line extending along the second direction F2, thereby leaving more space gap for an arrangement of second transparent conductive lines.

In some exemplary implementation modes, as shown in FIGS. 11 and 12, an anode 242a of a green second light emitting element 242 is electrically connected with a second adapter line 434a through a third adapter hole, and the second adapter line 434a is electrically connected with an anode connection terminal of a corresponding second pixel circuit 12 through a first adapter hole K11. Because an orthographic projection of a light emitting region 242b of the green second light emitting element 242 on the base substrate 30 is overlapped with an orthographic projection of the first adapter hole K11 on the base substrate 30, if the anode 242a of the green second light emitting element 242 is electrically connected directly with the anode connection terminal of the second pixel circuit 12 through the first adapter hole K11, film layer flatness of the light emitting region 242b of the green second light emitting element 242 will be affected adversely, thereby causing loss of an aperture ratio of the green second light emitting element 242 and affecting a display effect. In this example, a connection position of the anode 242a of the green second light emitting element 242 is transferred to a region other than the light emitting region 242b through the second adapter line 434a extending along the second direction F2 (that is, an orthographic projection of the light emitting region 242b of the green second light emitting element 242 on the base substrate 30 is not overlapped with an orthographic projection of the third adapter hole K13 electrically connected with the anode 242*a* on the base substrate 30), a film layer flattening processing is performed on the second planarization layer 42, then film layer flatness of the light emitting region 242*b* may be ensured so as to ensure an aperture ratio of the green second light emitting element 242 and a display effect.

In some exemplary implementation modes, as shown in FIGS. 11 and 12, an anode 243*a* of the green second light emitting element 243 may be electrically connected with the first adapter line 434*b* through a third adapter hole K13, and the first adapter line 434*b* may be electrically connected with an anode connection terminal of a corresponding second pixel circuit 12 through a first adapter hole K11. Because an orthographic projection of a first adapter hole K11 corresponding to the green second light emitting element 243 on the base substrate 30 is overlapped with an orthographic projection of an anode 245*a* of the blue second light emitting element 245 on the base substrate 30, if the anode 243*a* of the green second light emitting element 243 is electrically connected directly with the second pixel circuit 12 through the first adapter hole K11, there is a case of short circuit of the anode 243*a* of the green second light emitting element 243 and the anode 245*a* of the blue second light emitting element 245, which may cause poor display. In this example, a connection position of the anode 243*a* of the green second light emitting element 243 is moved to a region other than the anode 245*a* of the blue second light emitting element 245 (for example, the connection position is moved to a side close to the red second light emitting element 244) through the first adapter line 434*b* extending along the second direction F2, so that the anode 243*a* of the green second light emitting element 243 is electrically connected with a second pixel circuit 12. In this example, an orthographic projection of the anode 245*a* of the blue second light emitting element 245 on the base substrate 30 is not overlapped with an orthographic projection of the anode 243*a* of the green second light emitting element 243 on the base substrate 30, so that a case of short circuit of adjacent second light emitting elements may be avoided, thereby ensuring a display effect.

In some exemplary implementation modes, as shown in FIGS. 11 and 12, an anode 241*a* of the green second light emitting element 241 may be electrically connected with a corresponding second pixel circuit 12 via a first adapter hole K11 through a connection electrode 433*a*, an anode 244*a* of the red second light emitting element 244 may be electrically connected with a corresponding second pixel circuit 12 via a first adapter hole K11 through a connection electrode 433*b*, and the anode 245*a* of the blue second light emitting element 245 may be electrically connected with a corresponding second pixel circuit 12 via a first adapter hole K11 through a connection electrode 433*c*.

In this exemplary implementation mode, in a fourth sub-display region, a second pixel circuit and a second sub-light emitting element that are dislocated may be electrically connected through a first adapter line, and the first adapter line extends along a second direction, so that an anode of a second sub-light emitting element may be electrically connected with a corresponding second pixel circuit, and a risk of short circuit of the second sub-light emitting element and a third sub-light emitting element may be avoided. A second pixel circuit and a fourth sub-light emitting element that are dislocated may be electrically connected through a second adapter line, and the second adapter line extends along the second direction, thereby improving a case of aperture ratio loss of the fourth sub-light emitting element. Moreover, by arranging the first adapter line and the second adapter line both extending along the second direction, arrangement space may be provided for a second transparent conductive line electrically connecting a first pixel circuit and a first light emitting element, thereby avoiding an influence on an arrangement of second transparent conductive lines.

With reference to FIGS. 13 and 14, a structure of the fifth sub-display region will be described by taking green second light emitting elements 251 to 253, a red second light emitting element 254, and a blue second light emitting element 255 in FIG. 13 as examples. Among them, a green second light emitting element 253 is taken as an example of a second sub-light emitting element, the blue second light emitting element 255 is taken as an example of a third sub-light emitting element, and a green second light emitting element 252 is taken as an example of a fourth sub-light emitting element.

In some exemplary implementation modes, as shown in FIGS. 13 and 14, an electrical connection layer of a fifth sub-display region A23 of a second display region A2 may include a plurality of connection electrodes (e.g., connection electrodes 435*a* to 435*c*), and a plurality of third adapter lines (e.g., a second adapter line 436*a* and a first adapter line 436*b*). Each connection electrode may be electrically connected with an anode connection terminal of a second pixel circuit 12 through a first adapter hole K11. Each adapter line may be electrically connected with an anode connection terminal of a second pixel circuit 12 through a first adapter hole K11. Because a first pixel circuit of the fifth sub-display region A23 does not need to be electrically connected with a first light emitting element of the first display region A1, a first transparent conductive line and a second transparent conductive line electrically connecting the first pixel circuit and the first light emitting element do not need to be arranged in the fifth sub-display region A23. Therefore, extension directions of a first adapter line and a second adapter line in the fifth sub-display region A23 are not limited, for example, they may extend along a first direction F1, a second direction F2, a third direction F3, or a fourth direction F4.

In some exemplary implementation modes, as shown in FIGS. 13 and 14, an anode 252*a* of a green second light emitting element 252 is electrically connected with a second adapter line 436*a* through a third adapter hole, and the second adapter line 436*a* is electrically connected with an anode connection terminal of a corresponding second pixel circuit 12 through a first adapter hole K11. In this example, a connection position of the anode 252*a* of the green second light emitting element 252 is transferred to a region other than the light emitting region 252*b* through the second adapter line 436*a* extending along the second direction F2 (that is, an orthographic projection of the light emitting region 252*b* of the green second light emitting element 252 on the base substrate 30 is not overlapped with an orthographic projection of the third adapter hole K13 electrically connected with the anode 252*a* on the base substrate 30), a film layer flattening processing is performed on the second planarization layer 42, then film layer flatness of the light emitting region 252*b* may be ensured so as to ensure an aperture ratio of the green second light emitting element 252 and a display effect.

In some exemplary implementation modes, as shown in FIGS. 13 and 14, an anode 253*a* of the green second light emitting element 253 may be electrically connected with the first adapter line 436*b* through a third adapter hole K13, and the first adapter line 436*b* may be electrically connected with an anode connection terminal of a corresponding second pixel circuit 12 through a first adapter hole K11. In this example, a connection position of the anode 253*a* of the green second light emitting element 253 is moved to a region other than the anode 255*a* of the blue second light emitting element 255 (for example, the connection position is moved to a side close to the red second light emitting element 254) through the first adapter line 436*b* extending along the fourth direction F4, so that the anode 253*a* of the green second light emitting element 253 is electrically connected with a second pixel circuit 12. In this example, an orthographic projection of the anode 255*a* of the blue second light emitting element 255 on the base substrate 30 is not overlapped with an orthographic projection of the anode 253*a* of the green second light emitting element 253 on the base substrate 30, so that a case of short circuit of adjacent second light emitting elements may be avoided, thereby ensuring a display effect.

In some exemplary implementation modes, as shown in FIGS. 13 and 14, an anode 251*a* of the green second light emitting element 251 may be electrically connected with a corresponding second pixel circuit 12 via a first adapter hole K11 through a connection electrode 435*a*, an anode 254*a* of the red second light emitting element 254 may be electrically connected with a corresponding second pixel circuit 12 via a first adapter hole K11 through a connection electrode 435*b*, and the anode 255*a* of the blue second light emitting element 255 may be electrically connected with a corresponding second pixel circuit 12 via a first adapter hole K11 through a connection electrode 435*c*. As shown in FIG. 14, at least one adapter line of the fifth sub-display region may extend along the third direction F3, or may extend first along the second direction F2 and then extend along the fourth direction F4. However, this embodiment is not limited thereto.

In some examples, the first direction F1 intersects vertically with the second direction F2, and the third direction F3 intersects vertically with the fourth direction F4, the third direction F3 is located between the first direction F1 and the second direction F2, and an included angle between the third direction F3 and the first direction F1 along a clockwise direction is about 45 degrees. However, this embodiment is not limited thereto. For example, the included angle between the third direction F3 and the first direction F1 along the clockwise direction may be about 30 degrees to 60 degrees.

In this exemplary implementation mode, in the fifth sub-display region, a second pixel circuit and a second sub-light emitting element that are dislocated may be electrically connected through a first adapter line, a second pixel circuit and a fourth sub-light emitting element that are dislocated may be electrically connected through a second adapter line, and extension directions of the first adapter line and the second adapter line are not limited, so that an electrical connection between an anode of a second light emitting element and a corresponding second pixel circuit may be achieved, and a case of aperture ratio loss of the fourth sub-light emitting element and a risk of short circuit of the second sub-light emitting element and a third sub-light emitting element may be improved.

Figure 15:
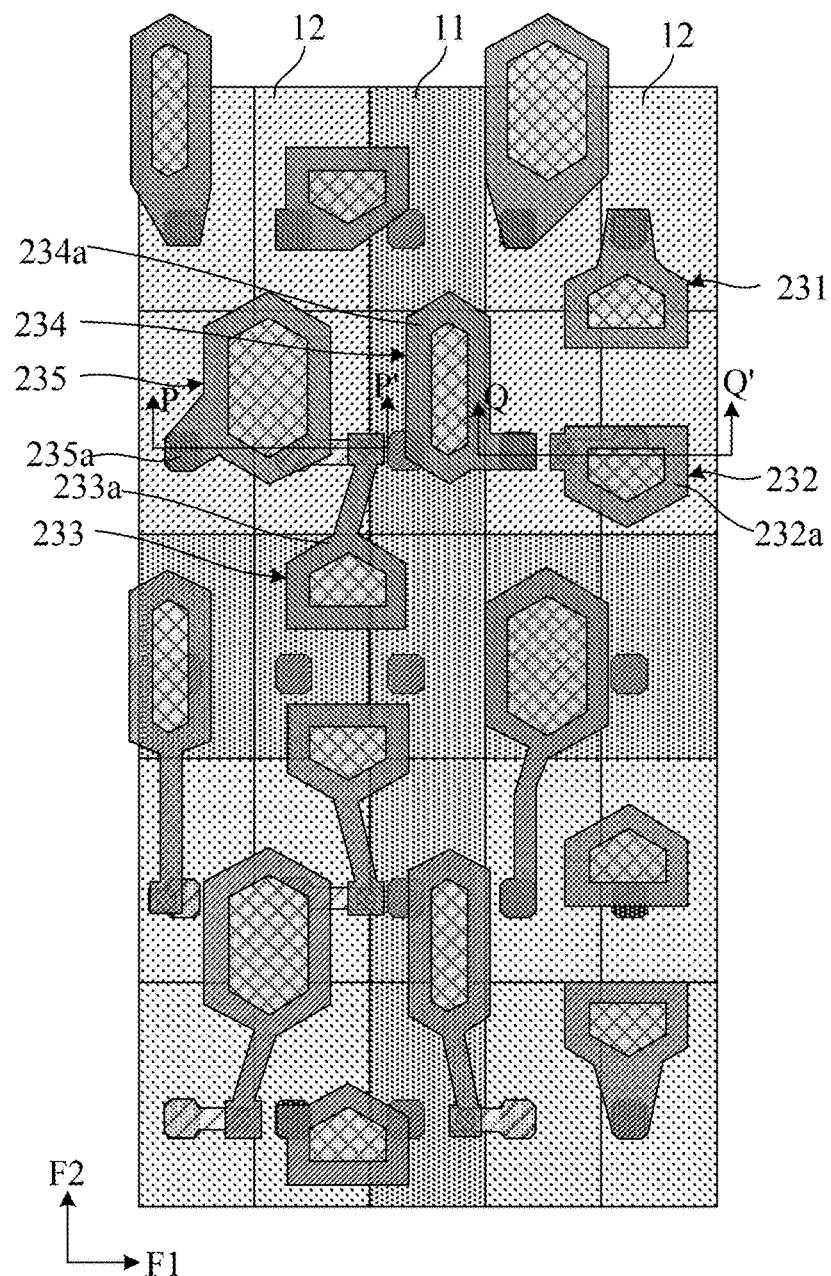
FIG. 15 is another partial plan view of a third sub-display region of the second display region in FIG. 1.
Figure 16A:
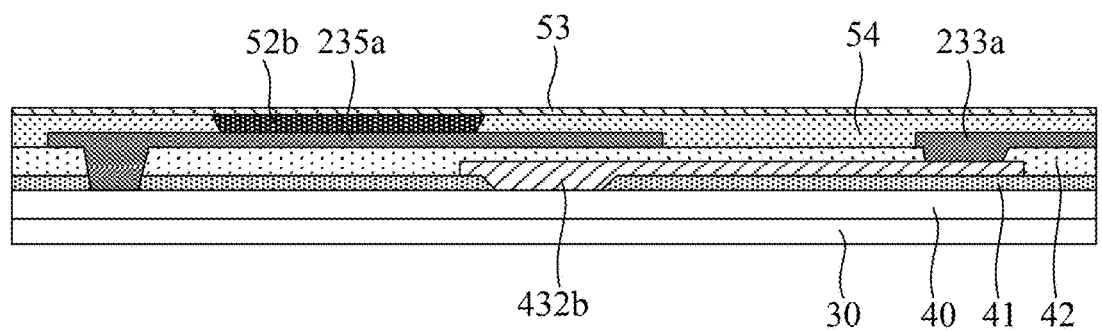
FIG. 16A is a partial sectional view along a P-P' direction in FIG. 15.
Figure 16B:
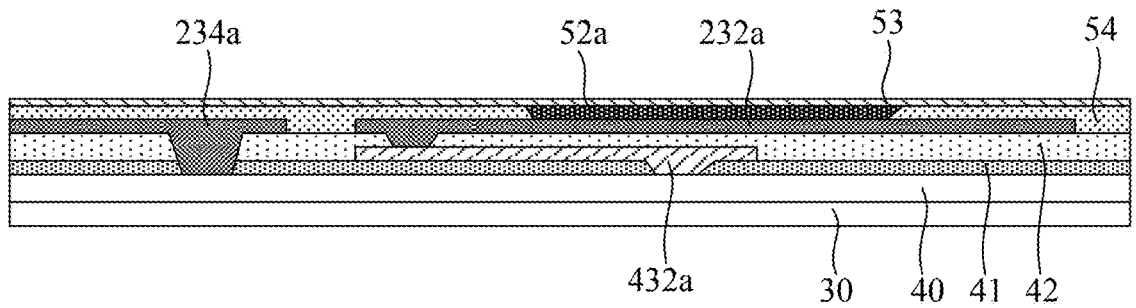
FIG. 16B is a partial sectional view along a Q-Q' direction in FIG. 15.

FIG. 15 is another partial plan view of a third sub-display region of the second display region in FIG. 1. FIG. 16A is a partial sectional view along a P-P' direction in FIG. 15. FIG. 16B is a partial sectional view along a Q-Q' direction in FIG. 15. In some exemplary implementation modes, as shown in FIGS. 15 to 16B, an electrical connection layer of a second display region A2 may include a plurality of adapter lines (for example, including a first adapter line 432*b* and a second adapter line 432*a*), a plurality of first transparent conductive lines, and a plurality of second transparent conductive lines. Taking a red second light emitting element 234 as an example, an anode 234*a* of the red second light emitting element 234 is electrically connected directly with an anode connection terminal of a second pixel circuit 12 through an adapter hole provided in a first planarization layer 41 and a second planarization layer 42 without being transferred through a connection electrode.

Rest of the structure of the display substrate according to this embodiment may be referred to descriptions of the aforementioned embodiments, and will not be repeated here.

In some exemplary implementation modes, a pixel circuit may include a plurality of transistors and at least one storage capacitor. A transistor may include an active layer, a gate, a first electrode, and a second electrode. The storage capacitor may include a first capacitor electrode plate and a second capacitor electrode plate. The gate of the transistor and one of capacitor electrode plates of the storage capacitor may be of a same layer structure, and the first electrode and the second electrode of the transistor may be of a same layer structure.

A structure of a pixel circuit layer will be described below by taking a case where a pixel circuit of a second display region is of the 7T1C structure shown in FIG. 2 as an example. In this example, a first transistor is the aforementioned threshold compensation transistor T2.

Figure 17:
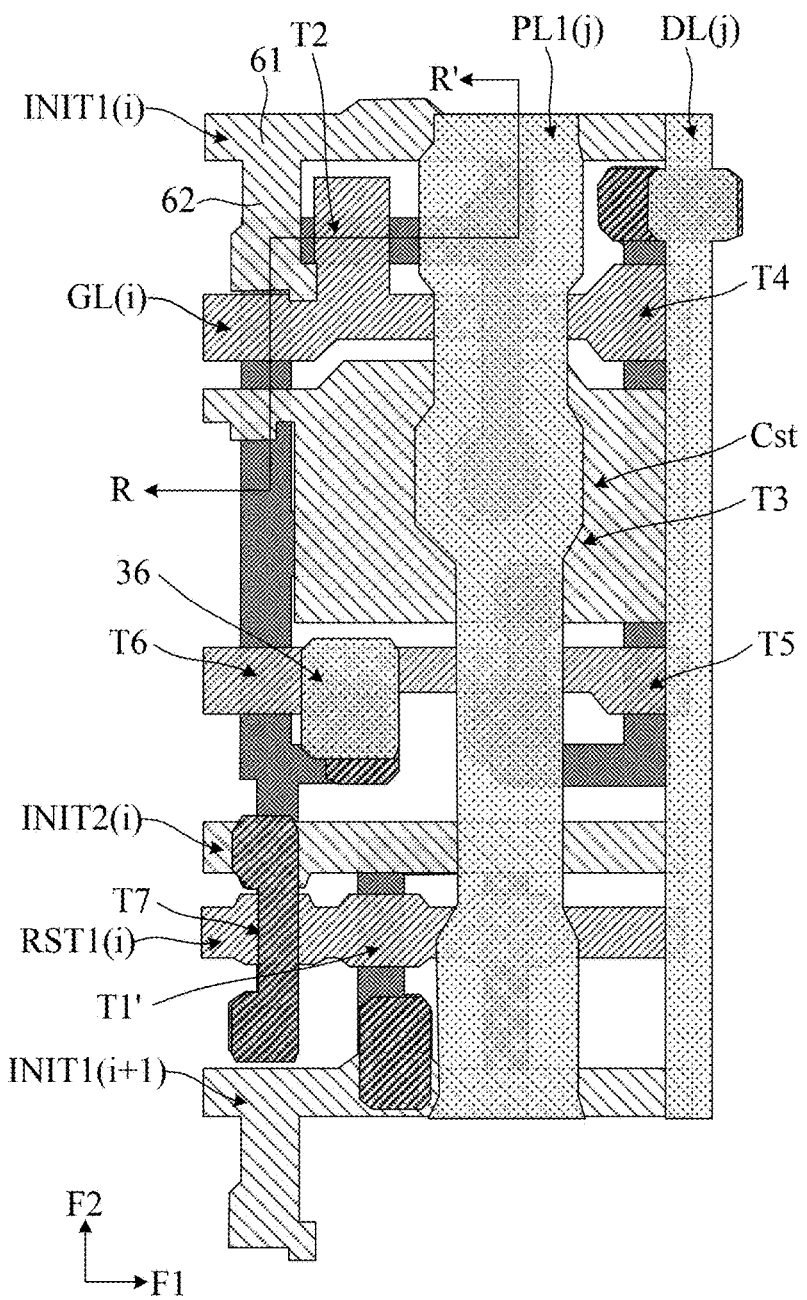
FIG. 17 is a top view of a pixel circuit according to at least one embodiment of the present disclosure.
Figure 18:
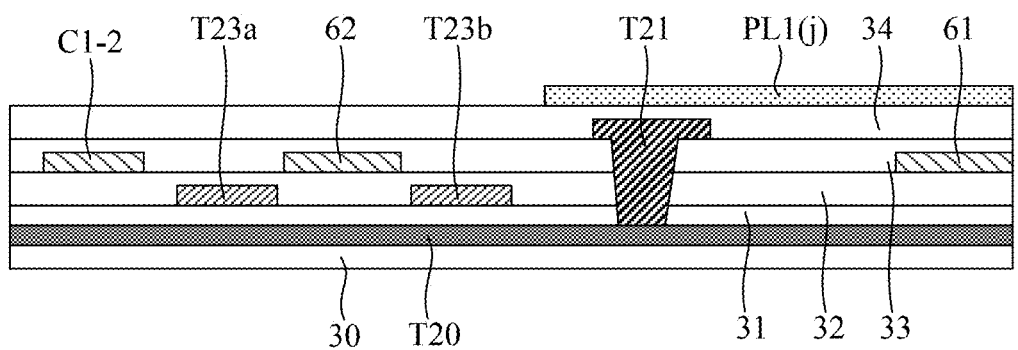
FIG. 18 is a partial sectional view along an R-R' direction in FIG. 17.
Figure 19:
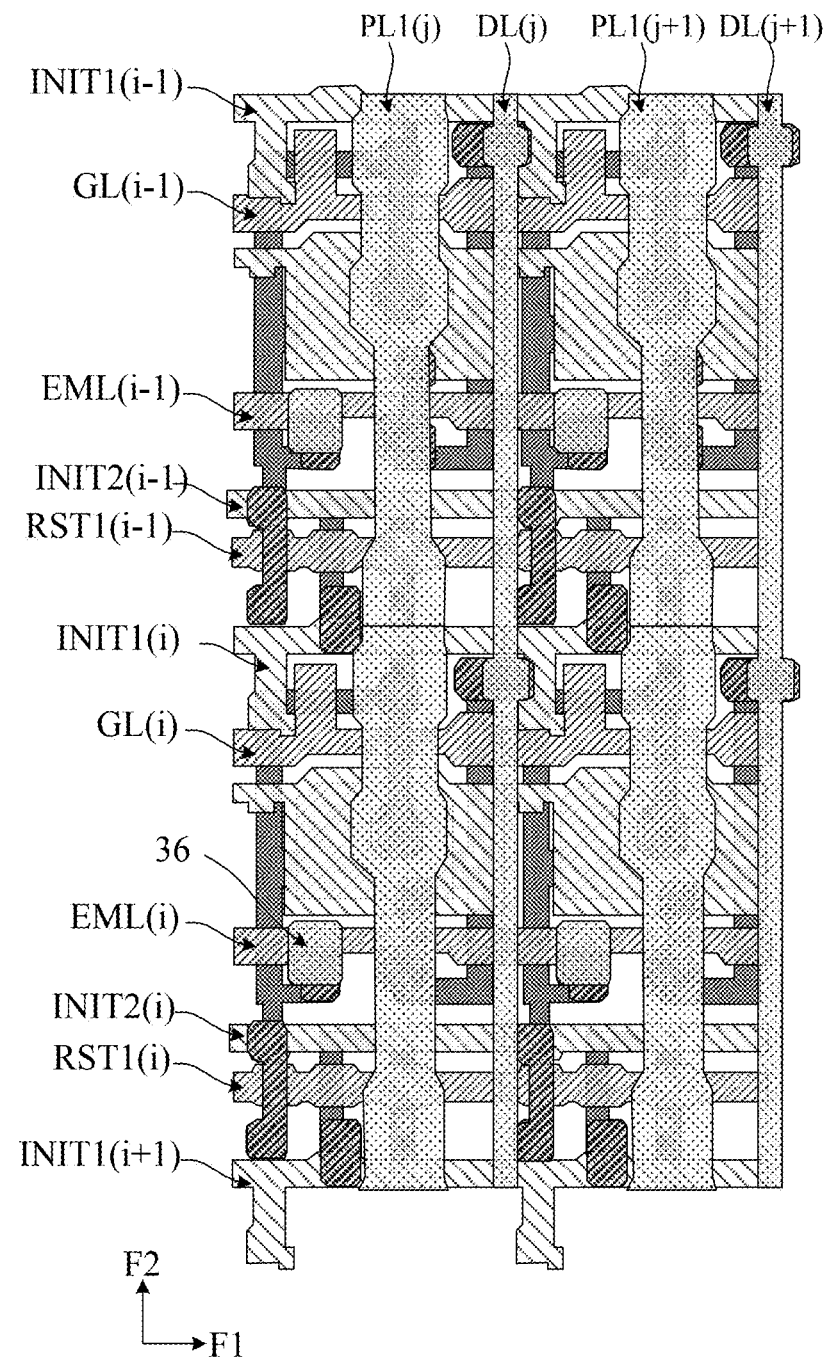
FIG. 19 is a partial top view of a second display region according to at least one embodiment of the present disclosure.
Figure 20:
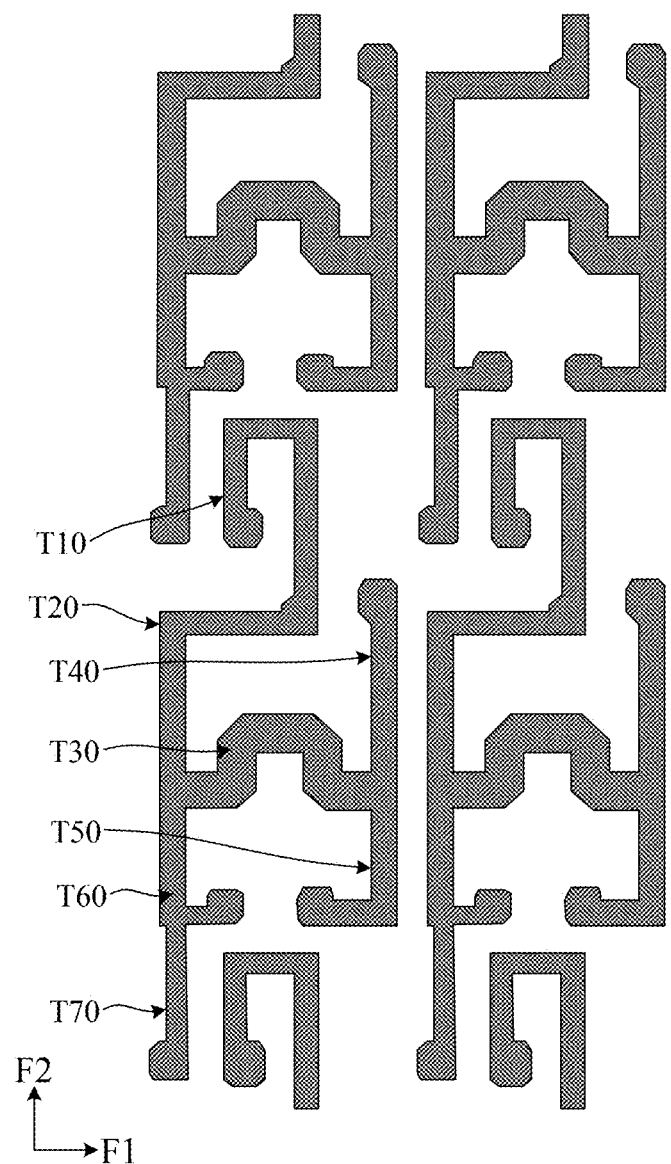
FIG. 20 is a top view of a second display region after a semiconductor layer is formed according to at least one embodiment of the present disclosure.
Figure 21:
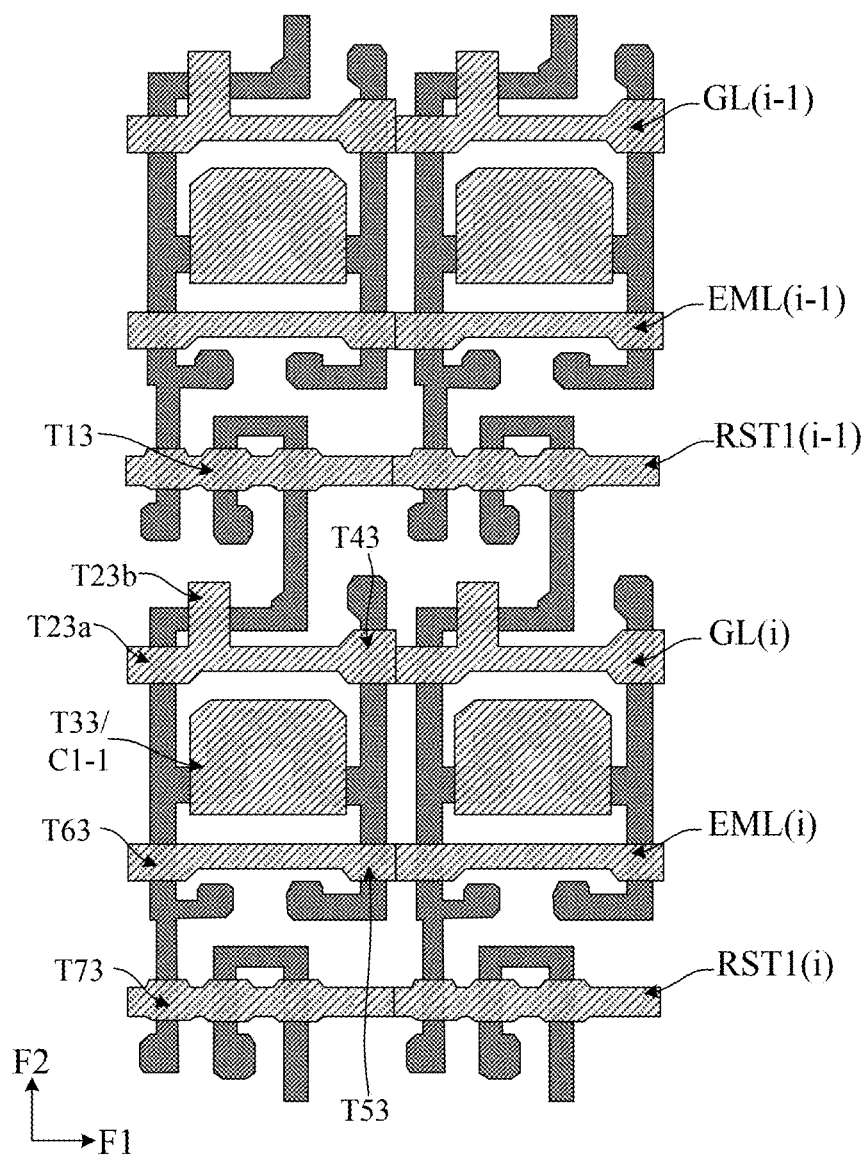
FIG. 21 is a top view of a second display region after a first conductive layer is formed according to at least one embodiment of the present disclosure.
Figure 22:
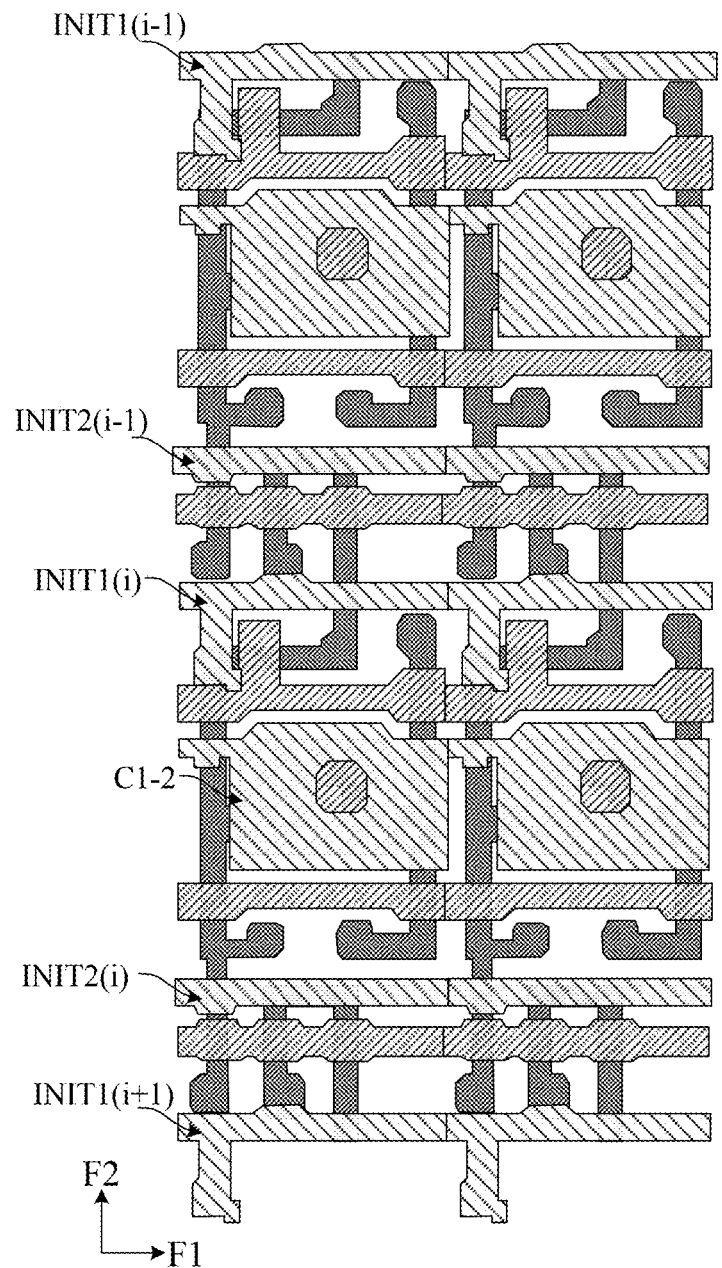
FIG. 22 is a top view of a second display region after a second conductive layer is formed according to at least one embodiment of the present disclosure.
Figure 23:
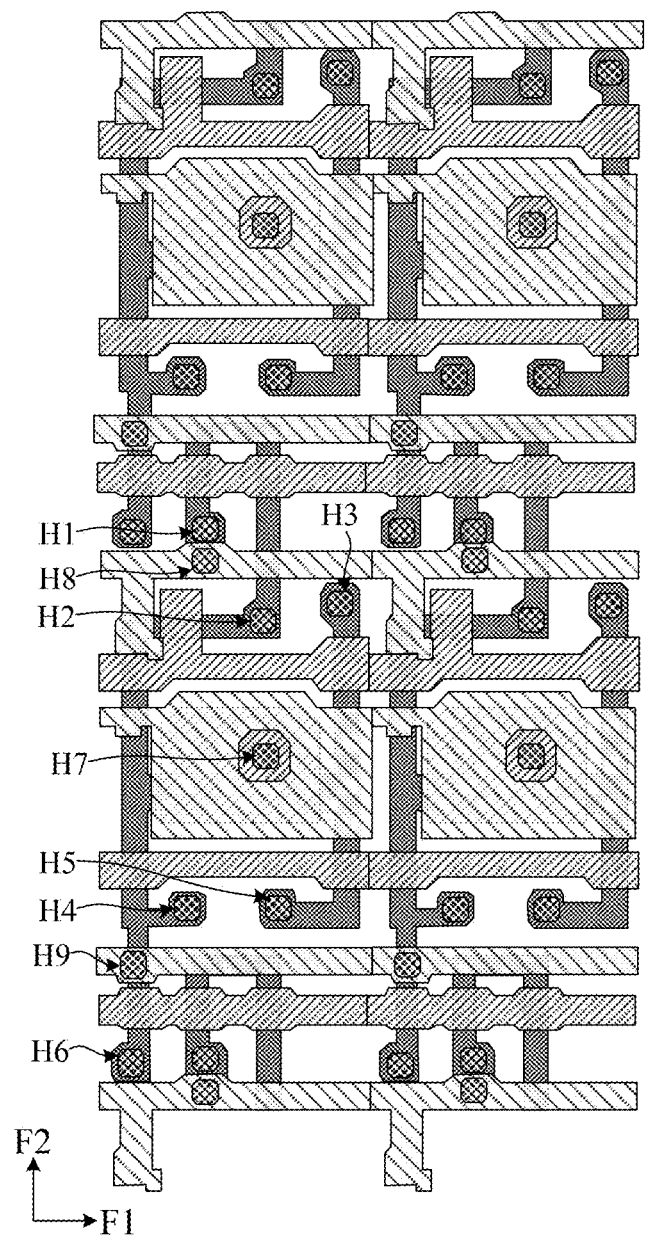
FIG. 23 is a top view of a second display region after a third insulation layer is formed according to at least one embodiment of the present disclosure.
Figure 24:
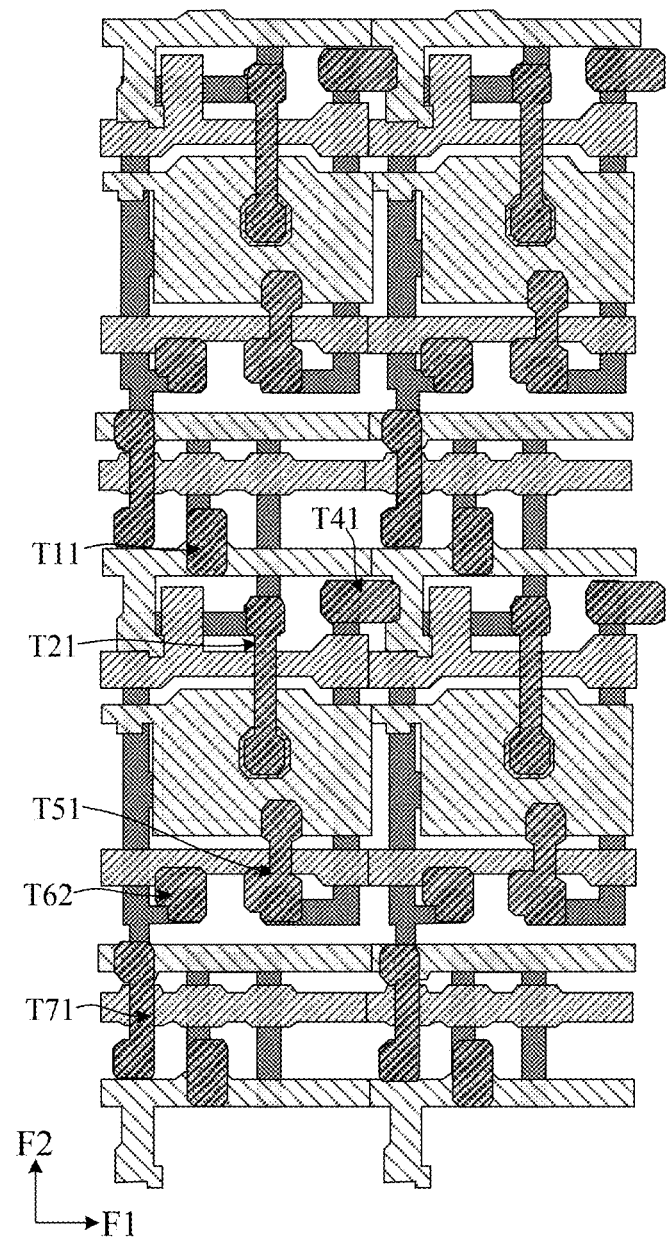
FIG. 24 is a top view of a second display region after a third conductive layer is formed according to at least one embodiment of the present disclosure.
Figure 25:
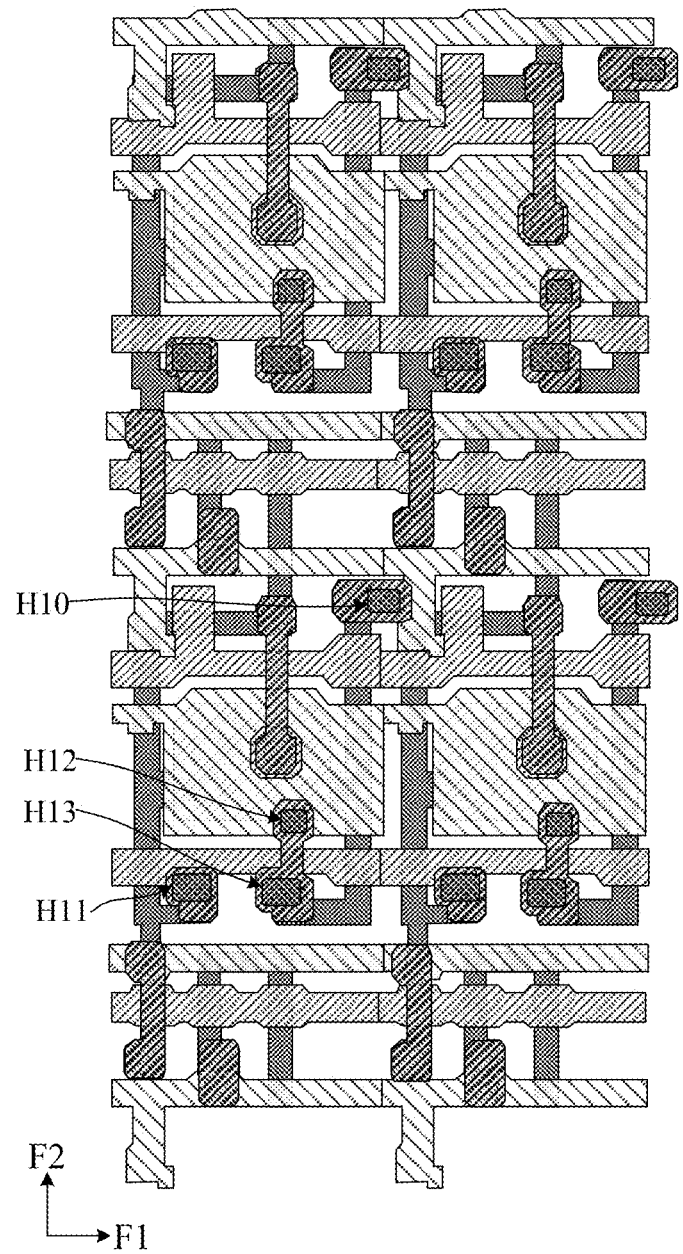
FIG. 25 is a top view of a second display region after a fourth insulation layer is formed according to at least one embodiment of the present disclosure.

FIG. 17 is a top view of a pixel circuit according to at least one embodiment of the present disclosure. FIG. 18 is a partial sectional view along an R-R' direction in FIG. 17. FIG. 19 is a partial top view of a second display region according to at least one embodiment of the present disclosure. FIG. 20 is a top view of a second display region after a semiconductor layer is formed according to at least one embodiment of the present disclosure. FIG. 21 is a top view of a second display region after a first conductive layer is formed according to at least one embodiment of the present disclosure. FIG. 22 is a top view of a second display region after a second conductive layer is formed according to at least one embodiment of the present disclosure. FIG. 23 is a top view of a second display region after a third insulation layer is formed according to at least one embodiment of the present disclosure. FIG. 24 is a top view of a second display region after a third conductive layer is formed according to at least one embodiment of the present disclosure. FIG. 25 is a top view of a second display region after a fourth insulation layer is formed according to at least one embodiment of the present disclosure. Planar structures of four pixel circuits are schematically illustrated in FIGS. 19 to 25.

In some exemplary implementation modes, as shown in FIGS. 17 to 25, in a direction perpendicular to a display substrate, a pixel circuit layer of a second display region A2 may include a semiconductor layer, a first conductive layer, a second conductive layer, a third conductive layer, and a fourth conductive layer that are disposed on a base substrate 30. A first insulation layer 31 is disposed between the semiconductor layer and the first conductive layer, a second insulation layer 32 is disposed between the first conductive layer and the second conductive layer, a third insulation layer 33 is disposed between the second conductive layer and the third conductive layer, and a fourth insulation layer 34 is disposed between the third conductive layer and the fourth conductive layer. In some examples, the first insulation layer 31 to the fourth insulation layer 34 may all be inorganic insulation layers. The first conductive layer may also be referred to as a first gate metal layer, the second conductive layer may also be referred to as a second gate metal layer, the third conductive layer may also be referred to as a first source-drain metal layer, and the fourth conductive layer may also be referred to as a second source-drain metal layer. However, this embodiment is not limited thereto.

In some exemplary implementation modes, as shown in FIGS. 17 to 25, the semiconductor layer of the second display region A2 at least includes active layers of a plurality of transistors of a pixel circuit. The first conductive layer at least includes gates of the plurality of transistors and a first capacitor electrode plate of a storage capacitor of a pixel circuit, a scan line, a light emitting control line, and a first reset control line. The second conductive layer at least includes a second capacitor electrode plate of the storage capacitor of the pixel circuit, a first initial signal line, and a second initial signal line. The third conductive layer at least includes a first electrode and a second electrode of at least one transistor of the pixel circuit. The fourth conductive layer at least includes a data line and a first power supply line.

Hereinafter, an exemplary description will be given for a preparation process of a display substrate with reference to FIGS. 17 to 25 and FIGS. 6 to 14. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film formed by a material on a base substrate through deposition, coating, or other processes. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern".

In some exemplary implementation modes, a preparation process of a display substrate may include following operations.

(1) Forming a Semiconductor Layer.

In some exemplary implementation modes, forming a semiconductor layer may include: depositing a semiconductor thin film on a base substrate 30, and patterning the semiconductor thin film through a patterning process to form a semiconductor layer in a second display region. As shown in FIG. 20, a semiconductor layer of a second display region A1 at least includes: active layers of a plurality of transistors of a pixel circuit, e.g., an active layer T10 of a first reset transistor T1, an active layer T20 of a threshold compensation transistor T2, an active layer T30 of a drive transistor T3, an active layer T40 of a data writing transistor T4, an active layer T50 of a first light emitting control transistor T5, an active layer T60 of a second light emitting control transistor T6, and an active layer T70 of a second reset transistor T7. Active layers T10 to T70 of seven transistors of one pixel circuit may be of an integral structure connected with each other.

In some exemplary implementation modes, a material of the semiconductor layer may include, for example, polysilicon. An active layer may include at least one channel region and a plurality of doped regions. The channel region may not be doped with an impurity, and has characteristics of a semiconductor. The plurality of doped regions may be on two sides of the channel region and doped with impurities, and thus have conductivity. The impurities may be changed according to a type of a transistor. In some examples, a doped region of the active layer may be interpreted as a source or a drain of a transistor. A part of the active layer between the transistors may be interpreted as a wiring doped with an impurity, and may be used for electrically connecting the transistors.

In some exemplary implementation modes, the base substrate 30 may be a rigid substrate, e.g., a glass substrate. However, this embodiment is not limited thereto. For example, the base substrate may be a flexible substrate.

(2) Forming a First Conductive Layer.

In some exemplary implementation modes, a first insulation thin film and a first conductive thin film are sequentially deposited on the base substrate 30 where the aforementioned structure is formed, and the first conductive thin film is patterned through a patterning process to form a first insulation layer 31 covering the semiconductor layer and the first conductive layer disposed on the first insulation layer 31. As shown in FIG. 21, the first conductive layer of the second display region A2 at least includes: gates of a plurality of transistors of a pixel circuit (e.g., a gate T13 of a first reset transistor T1, a first gate T23a and a second gate T23b of a threshold compensation transistor T2, a gate T33 of a drive transistor T3, a gate T43 of a data writing transistor T4, a gate T53 of a first light emitting control transistor T5, a gate T63 of a second light emitting control transistor T6, and a gate T73 of a second reset transistor T7), a first capacitor electrode plate C1-1 of a storage capacitor Cst of a pixel circuit, a plurality of scan lines (e.g., scan lines GL (i−1) and GL (i)), a plurality of light emitting control lines (e.g., light emitting control lines EML (i−1) and EML (i)), and a plurality of first reset control lines (e.g., first reset control lines RST1 (i−1) and RST1 (i)). Among them, i is an integer.

In some exemplary implementation modes, as shown in FIG. 21, a first capacitor electrode plate C1-1 of a storage capacitor Cst of an ith row pixel circuit and the gate T33 of the drive transistor T3 may be of an integral structure. A gate T73 of a second reset transistor T7 of the ith row pixel circuit, a first reset control line RST1 (i), and a gate of a first reset transistor T1' of an (i+1)th row pixel circuit may be of an integral structure. A gate T13 of a first reset transistor T1 of the ith row pixel circuit, a gate of a second reset transistor of an (i−1)th row pixel circuit, and a first reset control line RST1 (i−1) may be of an integral structure. A first gate T23a and a second gate T23b of a threshold compensation transistor T2, a gate T43 of a data writing transistor T4 of the ith row pixel circuit, and a scan line GL (i) may be of an integral structure. A gate T53 of a first light emitting control transistor T5, a gate T63 of a second light emitting control transistor T6 of the ith row pixel circuit, and a light emitting control line EML (i) may be of an integral structure. However, this embodiment is not limited thereto.

(3) Forming a Second Conductive Layer.

In some exemplary implementation modes, a second insulation thin film and a second conductive thin film are sequentially deposited on the base substrate 30 where the aforementioned structures are formed, and the second conductive thin film is patterned through a patterning process to form a second insulation layer 32 covering the first conductive layer and a second conductive layer disposed on the second insulation layer 32. As shown in FIG. 22, the second conductive layer of the second display region A2 at least includes: a second capacitor electrode plate C1-2 of a storage capacitor Cst of a pixel circuit, a plurality of first initial signal lines (e.g. first initial signal lines INIT1 (i−1), INIT1 (i), and INIT1 (i+1)), and a plurality of second initial signal lines (e.g. second initial signal lines INIT2 (i−1) and INIT2 (i)).

In some exemplary implementation modes, a plurality of first initial signal lines and a plurality of second initial signal lines all extend along a first direction F1. For example, an orthographic projection of the first initial signal line INIT1 (i) on the base substrate 30 is located between orthographic projections of the scan line GL (i) and the first reset control line RST1 (i−1) on the base substrate 30. An orthographic projection of the second initial signal line INIT2 (i) on the base substrate 30 is located between orthographic projections of the light emitting control line EML (i) and the first reset control line RST1 (i) on the base substrate 30.

In some exemplary implementation modes, as shown in FIG. 17, taking a first initial signal line INIT1 (i) as an example, the first initial signal line INIT1 (i) includes a body portion 61 and a protrusion portion 62. The body portion 61 extends along a first direction F1 and the protrusion portion 62 extends from the body portion 61 along a second direction F2. The protrusion portion 62 of the first initial signal line INIT1 (i) extends along the second direction F2 toward a side close to a scan line GL (i). An active layer T20 of a threshold compensation transistor T2 (i.e. a first transistor) may include a first channel region, a second channel region, and a third channel region. The third channel region is connected between the first channel region and the second channel region. The first channel region extends along the second direction F2, the second channel region extends along the first direction F1, the third channel region is a corner connecting the first channel region and the second channel region, and an orthographic projection of the third channel region on a base substrate 30 may be of an inverted L-shape. An orthographic projection of a first gate T23a of the threshold compensation transistor T2 on the base substrate 30 may cover an orthographic projection of the first channel region on the base substrate 30, and an orthographic projection of a second gate T23b on the base substrate 30 may cover an orthographic projection of the second channel region on the base substrate 30. In this example, the first channel region and the second channel region are overlapping regions of an active layer and a gate; the third channel region is not overlapped with the gate, but serves as a connecting region between the first channel region and the second channel region. An orthographic projection of the protrusion portion 62 of the first initial signal line INIT1 (i) on the base substrate 30 is overlapped with an orthographic projection of the third channel region of the threshold compensation transistor T2 on the base substrate 30. That is, the protrusion portion 62 of the first initial signal line INIT1 (i) may block the third channel region of the active layer of the threshold compensation transistor T2. Because a first initial signal line may provide a fixed voltage signal, the active layer of the threshold compensation transistor T2 may be effectively shielded to ensure stability of the threshold compensation transistor T2. Using the first initial signal line to block the active layer of the threshold compensation transistor may save space, and may meet pixel design requirements of high resolution and high image quality, thereby improving performance of the display substrate.

(4) Forming a Third Insulation Layer.

In some exemplary implementation modes, a third insulation thin film is deposited on the base substrate 30 where the aforementioned patterns are formed, and the third insulation thin film is patterned through a patterning process to form a third insulation layer 33. As shown in FIG. 23, the third insulation layer 33 of the second display region A2 is provided with a plurality of vias, and the plurality of vias may at least include a first via H1 to a ninth via H9. Among them, the third insulation layer 33, the second insulation layer 32, and the first insulation layer 31 within the first via H1 to the sixth via H6 are removed to expose a surface of the semiconductor layer. The third insulation layer 33 and the second insulation layer 32 within the seventh via H7 are removed to expose a surface of the first conductive layer. The third insulation layer 33 within the eighth via H8 and the ninth via H9 is removed to expose a surface of the second conductive layer.

(5) Forming a Third Conductive Layer.

In some exemplary implementation modes, a third conductive thin film is deposited on the base substrate 30 where the aforementioned patterns are formed, and the third conductive thin film is patterned through a patterning process to form a third conductive layer on the third insulation layer 33. As shown in FIG. 24, the third conductive layer of the second display region A2 at least includes: first electrodes and second electrodes of a plurality of transistors of a pixel circuit (for example, a first electrode T11 of a first reset transistor T1, a first electrode T21 of a threshold compensation transistor T2, a first electrode T41 of a data writing transistor T4, a first electrode T51 of a first light emitting control transistor T5, a second electrode T62 of a second light emitting control transistor T6, and a first electrode T71 of a second reset transistor T7).

In some exemplary implementation modes, as shown in FIG. 24, the first electrode T11 of the first reset transistor T1 may be electrically connected with a first doped region of an active layer T10 of the first reset transistor T1 through a first via H1, and may be electrically connected with a first initial signal line INIT1 (i) through an eighth via H8. The first electrode T21 of the threshold compensation transistor T2 may be electrically connected with a second doped region of an active layer of the threshold compensation transistor T2 through a second via H2, and may be electrically connected with a gate T33 of a drive transistor T3 through a seventh via H7. The first electrode T41 of the data writing transistor T4 may be electrically connected with a first doped region of an active layer T40 of the data writing transistor T4 through a third via H3. The second electrode T62 of the second light emitting control transistor T6 may be electrically connected with a second doped region of an active layer T60 of the second light emitting control transistor T6 through a fourth via H4. The first electrode T51 of the first light emitting control transistor T5 may be electrically connected with a first doped region of an active layer T50 of the first light emitting control transistor T5 through a fifth via H5. The first electrode T71 of the second reset transistor T7 may be electrically connected with a first doped region of an active layer T70 of the second reset transistor T7 through a sixth via H6, and may be electrically connected with a second initial signal line INIT2 (i) through a ninth via H9.

(6) Forming a Fourth Insulation Layer.

In some exemplary implementation modes, a fourth insulation thin film is deposited on the base substrate 30 where the aforementioned patterns are formed, and the fourth insulation thin film is patterned through a patterning process to form a fourth insulation layer 34. As shown in FIG. 25, the fourth insulation layer 34 of the second display region A2 is provided with a plurality of vias, for example, the plurality of vias may include a tenth via H10 to a thirteenth via H13. The fourth insulation layer 34 within the tenth via H10 to the thirteenth via H13 is removed to expose a surface of the third conductive layer.

(7) Forming a Fourth Conductive Layer.

In some exemplary implementation modes, a fourth conductive thin film is deposited on the base substrate 30 where the aforementioned patterns are formed, and the fourth conductive thin film is patterned through a patterning process to form a fourth conductive layer on the fourth insulation layer 34. As shown in FIG. 19, the fourth conductive layer of the second display region A2 at least includes an anode connection terminal (e.g. an anode connection terminal 36), a plurality of data lines (e.g. data lines DL (j) and DL (j+1)), and a plurality of first power supply lines (e.g. first power supply lines PL1 (j) and PL1 (j+1)). The data lines and the first power supply lines all extend along a second direction F2, and the data lines and the first power supply lines are arranged at intervals along a first direction F1. Among them, j is an integer.

In some exemplary implementation modes, the data line DL (j) may be electrically connected with the first electrode T41 of the data writing transistor T4 through the tenth via H10. The first power supply line PL1 (j) may be electrically connected with the first electrode T51 of the first light emitting control transistor T5 through the twelfth via H12 and the thirteenth via H13. The anode connection terminal 36 may be electrically connected with the second electrode T62 of the second light emitting control transistor T6 through the eleventh via H11. An anode connection terminal 36 of a pixel circuit may subsequently be electrically connected with a light emitting element.

So far, preparation of the pixel circuit layer of the second display region A2 is completed. A first display region A1 may include: the base substrate 30, the first insulation layer 31, the second insulation layer 32, the third insulation layer 33, and the fourth insulation layer 34 that are stacked on the base substrate 30.

(8) Forming a First Planarization Layer.

In some exemplary implementation modes, a first planarization thin film is coated on the base substrate 30 formed with the aforementioned patterns, and the first planarization thin film is patterned through a patterning process to form a first planarization layer 41. As shown in FIG. 8, the first planarization layer 41 is provided with a plurality of first adapter holes K11 and a plurality of second adapter holes K12. The first planarization layer 41 in the first adapter holes K11 is removed so as to expose an anode connection terminal of a second pixel circuit, and the first planarization layer 41 in the second adapter holes K12 is removed so as to expose an anode connection terminal of a first pixel circuit.

(9) Forming an Electrical Connection Layer.

In some exemplary implementation modes, a transparent conductive thin film is deposited on the base substrate 30 formed with the aforementioned patterns, and the transparent conductive thin film is patterned through a patterning process to form an electrical connection layer. As shown in FIGS. 9, 12, and 14, the electrical connection layer may include a plurality of connection electrodes, a plurality of adapter lines (e.g., a first adapter line and a second adapter line), a plurality of first transparent conductive lines, and a plurality of second transparent conductive lines.

(10) Forming a Second Planarization Layer.

In some exemplary implementation modes, a second planarization thin film is coated on the base substrate 30 formed with the aforementioned patterns, and the second planarization thin film is patterned through a patterning process to form a second planarization layer 42. As shown in FIG. 10, the second planarization layer 42 is provided with a plurality of third adapter holes K13. The second planarization layer 42 in the third adapter holes K13 is removed to expose a surface of the electrical connection layer.

(11) Forming an Anode Layer, a Pixel Definition Layer, an Organic Emitting Layer, and a Cathode Layer.

In some exemplary implementation modes, an anode thin film is deposited on the base substrate 30 where the aforementioned patterns are formed, and the anode thin film is patterned through a patterning process to form an anode layer. Subsequently, a pixel definition thin film is coated on the base substrate 30 on which the aforementioned patterns are formed, and a pixel definition layer 54 is formed through mask, exposure, and development processes. The pixel definition layer 54 is formed with a plurality of pixel openings exposing the anode layer. Subsequently, an organic emitting layer is formed in the aforementioned pixel openings, and the organic emitting layer is connected with an anode. Subsequently, a cathode thin film is deposited, the cathode thin film is patterned through a patterning process to form a cathode layer 53, and the cathode layer 53 is electrically connected with the organic emitting layer and a second power supply line respectively. In some examples, an encapsulation layer is formed on the cathode layer. The encapsulation layer may include a stacked structure of an inorganic material/an organic material/an inorganic material.

In some exemplary implementation modes, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the aforementioned metals, such as an Aluminum-Neodymium alloy (AlNd) or a Molybdenum-Niobium alloy (MoNb), and may be in a single-layer structure, or a multi-layer composite structure such as Mo/Cu/Mo. The first insulation layer 31, the second insulation layer 32, the third insulation layer 33, and the fourth insulation layer 34 may be made of any one or more of Silicon Oxide (SiOx), Silicon Nitride (SiNx), and Silicon Oxynitride (SiON), and may be a single layer, a multi-layer, or a composite layer. The first insulation layer 31 and the second insulation layer 32 may be referred to as Gate Insulation (GI) layers, and the third insulation layer 33 and the fourth insulation layer 34 may be referred to as Interlayer Dielectric (ILD) layers. The first planarization layer 41 and the second planarization layer 42 may be made of an organic material, such as polyimide, acrylic, or polyethylene terephthalate. The pixel definition layer 54 may be made of an organic material, such as polyimide, acrylic, or polyethylene terephthalate. The anode layer may be made of a reflective material such as a metal, and the cathode layer may be made of a transparent conductive material. However, this embodiment is not limited thereto.

A structure and the preparation process of the display substrate of this embodiment are merely illustrative. In some exemplary implementation modes, a corresponding structure may be changed and a patterning process may be increased or decreased according to actual needs. For example, in an example shown in FIGS. 15 and 16, an adapter hole exposing the fourth conductive layer may be provided in a process of forming the second planarization layer, so that the second light emitting element, which does not need to be electrically connected with a second pixel circuit through an adapter line, may be electrically connected with an anode connection terminal of the second pixel circuit directly through an adapter hole penetrating the first planarization layer and the second planarization layer without being connected through a connection electrode. However, this embodiment is not limited thereto.

The preparation process of this exemplary embodiment may be implemented using an existing mature preparation device, and is compatible well with an existing preparation process, simple in process implementation, easy to implement, high in a production efficiency, low in a production cost, and high in a yield.

Figure 26:
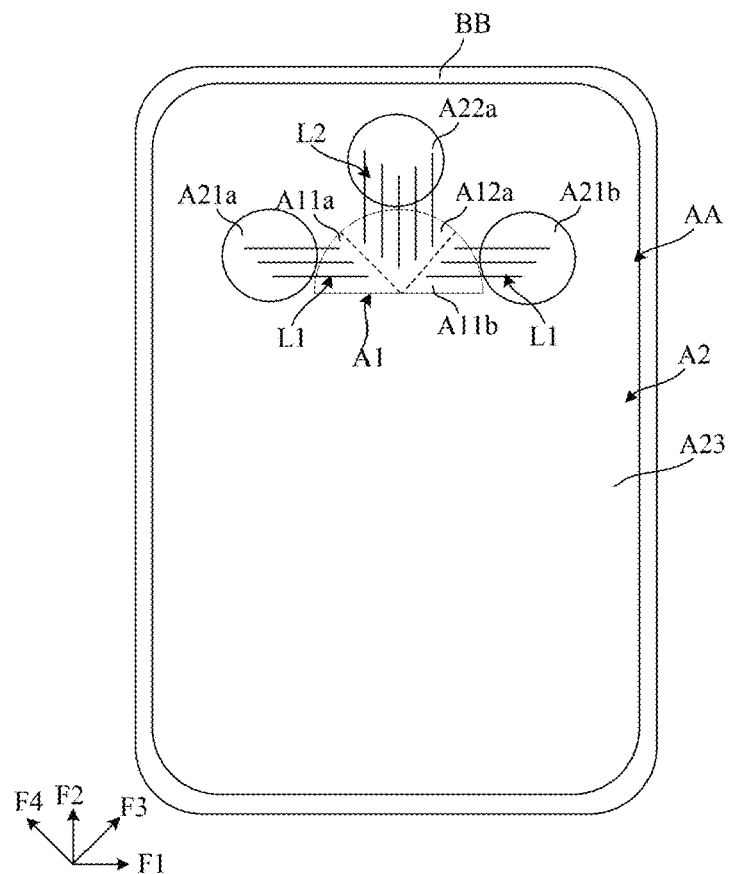
FIG. 26 is another schematic diagram of a display substrate according to at least one embodiment of the present disclosure.

FIG. 26 is another schematic diagram of a display substrate according to at least one embodiment of the present disclosure. In some exemplary implementation modes, as shown in FIG. 26, a first display region A1 may be semi-circular. The first display region A1 may include two first sub-display regions A11a and A11b arranged in sequence along a first direction F1, and a second sub-display region A12a located between the two first sub-display regions A11a and A11b. A second display region A2 may include two third sub-display regions A21a and A21b, a fourth sub-display region A22a, and a fifth sub-display region A23. The third sub-display region A21a is adjacent to the first sub-display region A11a in the first direction F1, and a first pixel circuit in the third sub-display region A21a is electrically connected with a first light emitting element in the first sub-display region A11a. The third sub-display region A21b is adjacent to the first sub-display region A11b in the first direction F1, and a first pixel circuit in the third sub-display region A21b is electrically connected with a first light emitting element in the first sub-display region A11b. The fourth sub-display region A22a is adjacent to the second sub-display region A12a, and a first pixel circuit in the fourth sub-display region A22a is electrically connected with a first light emitting element in the second sub-display region A12a.

Rest of the structure of the display substrate according to this embodiment may be referred to descriptions of the aforementioned embodiments, and will not be repeated here.

Figure 27:
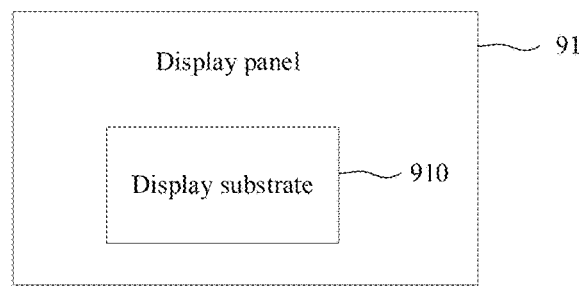
FIG. 27 is a schematic diagram of a display panel according to at least one embodiment of the present disclosure.

At least one embodiment of the present disclosure further provides a display panel which includes the display substrate as described above. FIG. 27 is a schematic diagram of the display panel according to at least one embodiment of the present disclosure. As shown in FIG. 27, a display panel 91 according to this embodiment may include a display substrate 910. The display substrate 910 may be as described in the aforementioned embodiments, so it will not be repeated here.

At least one embodiment of the present disclosure further provides a display apparatus, which includes the display panel as described above and a photosensitive sensor disposed on a side of a non-display surface of the display panel. An orthographic projection of the photosensitive sensor on the display panel is overlapped with a first display region of a display substrate.

Figure 28:
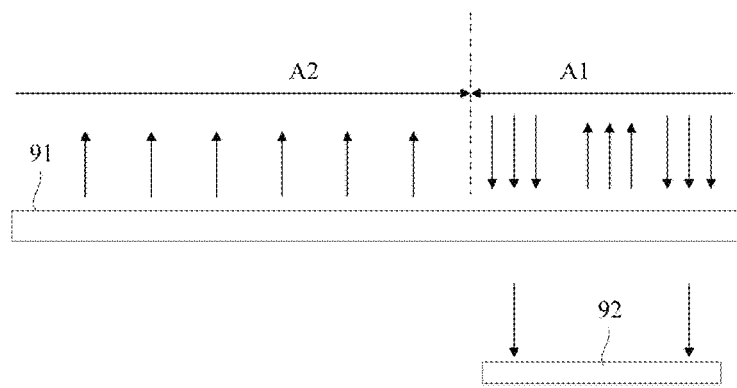
FIG. 28 is a schematic diagram of a display apparatus according to at least one embodiment of the present disclosure.

FIG. 28 is a schematic diagram of a display apparatus according to at least one embodiment of the present disclosure. As shown in FIG. 28, this embodiment provides a display apparatus, which includes a display panel 91 and a photosensitive sensor 92 located on a light exit side of a display structure layer away from the display panel 91 (that is, the photosensitive sensor 92 is located on a side of a non-display surface of the display panel 91). An orthographic projection of the photosensitive sensor 92 on the display panel 91 is overlapped with a first display region A1.

In some exemplary implementation modes, the display panel 91 may be a flexible OLED display panel, a QLED display panel, a Micro-LED display panel, or a Mini-LED display panel. The display device may be any product or component with a display function such as an OLED display, a cell phone, a tablet, a television, a display, a laptop, a digital photo frame, a navigator, and so on, which is not limited in the embodiments of the present disclosure.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict.

Those of ordinary skill in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising: a first display region and a second display region at least partially surrounding the first display region, wherein the display substrate comprises:
 a base substrate;
 a pixel circuit, located on the base substrate of the second display region, wherein the pixel circuit comprises a first pixel circuit and a second pixel circuit arranged alternately; and
 a light emitting element, located on a side of the pixel circuit away from the base substrate, wherein the light emitting element comprises a first light emitting element located in the first display region and a second sub-light emitting element and a third sub-light emitting element located in the second display region, and the first pixel circuit is electrically connected with the first light emitting element through at least a part of a transparent conductive line,
 wherein the second pixel circuit is electrically connected with the second sub-light emitting element through a first adapter hole, and an orthographic projection of the first adapter hole on the base substrate is overlapped with an orthographic projection of the third sub-light emitting element which is arranged adjacent to the second sub-light emitting element on the base substrate, and
 wherein at least one second pixel circuit in the second display region is electrically connected with a first adapter line through the first adapter hole, the first adapter line is electrically connected with the second sub-light emitting element, and an orthographic projection of a connection position of the first adapter line and the second sub-light emitting element on the base substrate is not overlapped with an orthographic projection of the third sub-light emitting element on the base substrate.

2. The display substrate according to claim 1, wherein:
 a first planarization layer is disposed between the first adapter line and the pixel circuit, and the first adapter line is electrically connected with the second pixel circuit through a first adapter hole provided in the first planarization layer;
 a second planarization layer is disposed between the first adapter line and the light emitting element, and the first adapter line is electrically connected with the second sub-light emitting element through a third adapter hole provided in the second planarization layer; and an orthographic projection of the third adapter hole on the base substrate is not overlapped with the orthographic projection of the third sub-light emitting element on the base substrate.

3. The display substrate according to claim 1, wherein the second display region comprises at least one third sub-display region, a first pixel circuit in the third sub-display region is electrically connected with a first light emitting element in the first display region through a first transparent conductive line, and the first transparent conductive line extends at least along a first direction; and
at least one second pixel circuit in the third sub-display region is electrically connected with the second sub-light emitting element through the first adapter line extending along the first direction.

4. The display substrate according to claim 3, wherein the second display region comprises at least one fourth sub-display region, a first pixel circuit in the fourth sub-display region is electrically connected with the first light emitting element in the first display region through a second transparent conductive line, the second transparent conductive line extends at least along a second direction, and the second direction crosses the first direction; and
at least one second pixel circuit in the fourth sub-display region is electrically connected with the second sub-light emitting element through the first adapter line extending along the second direction.

5. The display substrate according to claim 4, wherein:
the first display region comprises: at least one first sub-display region and at least one second sub-display region;
the third sub-display region is adjacent to at least one first sub-display region in the first direction, and the fourth sub-display region is adjacent to at least one second sub-display region in the second direction; and
length ranges of the first transparent conductive line and the second transparent conductive line are substantially identical.

6. The display substrate according to claim 1, wherein the second display region comprises: a fifth sub-display region; a first pixel circuit in the fifth sub-display region is a Dummy pixel circuit; and
at least one second pixel circuit in the fifth sub-display region is electrically connected with the second sub-light emitting element through the first adapter line extending along any direction.

7. The display substrate according to claim 1, wherein the light emitting element further comprises a fourth sub-light emitting element located in the second display region; and
at least one second pixel circuit in the second display region is electrically connected with the fourth sub-light emitting element through the first adapter hole, and the orthographic projection of the first adapter hole on the base substrate is overlapped with an orthographic projection of a light emitting region of the fourth sub-light emitting element on the base substrate.

8. The display substrate according to claim 7, wherein the second pixel circuit is electrically connected with a second adapter line through the first adapter hole, and the second adapter line is electrically connected with the fourth sub-light emitting element; and
an orthographic projection of a connection position of the second adapter line and the fourth sub-light emitting element on the base substrate is not overlapped with the orthographic projection of the light emitting region of the fourth sub-light emitting element on the base substrate.

9. The display substrate according to claim 8, wherein:
the second display region at least comprises: a third sub-display region and a fourth sub-display region;
a first pixel circuit in the third sub-display region is electrically connected with the first light emitting element in the first display region through a first transparent conductive line, and the first transparent conductive line extends at least along a first direction;
a first pixel circuit in the fourth sub-display region is electrically connected with the first light emitting element in the first display region through a second transparent conductive line, and the second transparent conductive line extends at least along a second direction, and the second direction crosses the first direction;
at least one second pixel circuit in the third sub-display region is electrically connected with the fourth sub-light emitting element through the second adapter line extending along the first direction; and
at least one second pixel circuit in the fourth sub-display region is electrically connected with the fourth sub-light emitting element through the second adapter line extending along the second direction.

10. The display substrate according to claim 1, wherein in the second display region, the first pixel circuit and the second pixel circuit are alternately arranged in both a first direction and a second direction; the first direction crosses the second direction.

11. The display substrate according to claim 10, wherein in the first direction, four columns of second pixel circuits and one column of first pixel circuits are alternately arranged, and in the second direction, four rows of second pixel circuits and one row of first pixel circuits are alternately arranged.

12. The display substrate according to claim 1, wherein:
the pixel circuit comprises: a drive transistor and a first transistor;
a first electrode of the first transistor is electrically connected with a gate of the drive transistor;
the first transistor is a double-gate transistor; and
the pixel circuit is electrically connected with a first initial signal line, an orthographic projection of the first initial signal line on the base substrate is overlapped with an orthographic projection of a channel region of an active layer of the first transistor on the base substrate.

13. The display substrate according to claim 12, wherein the channel region of the active layer of the first transistor comprises: a first channel region, a second channel region, and a third channel region, the third channel region is located between the first channel region and the second channel region; an orthographic projection of a first gate of the first transistor on the base substrate covers an orthographic projection of the first channel region on the base substrate, and an orthographic projection of a second gate of the first transistor on the base substrate covers an orthographic projection of the second channel region on the base substrate; and
an orthographic projection of the first initial signal line on the base substrate is overlapped with an orthographic projection of the third channel region of the active layer of the first transistor on the base substrate.

14. The display substrate according to claim 13, wherein the orthographic projection of the third channel region on the base substrate is of an inverted L-shape.

15. The display substrate according to claim 12, wherein the first initial signal line comprises: a body portion extending along a first direction and a protrusion portion extending from the body portion along a second direction; the first direction crosses the second direction; and an orthographic projection of the protrusion portion on the base substrate is overlapped with the orthographic projection of the channel region of the active layer of the first transistor on the base substrate.

16. The display substrate according to claim 12, wherein the pixel circuit comprises a plurality of transistors and at least one storage capacitor; each transistor comprises an active layer, a gate, a first electrode, and a second electrode, the storage capacitor comprises a first capacitor electrode plate and a second capacitor electrode plate, the gate of the transistor and one of capacitor electrode plates of the storage capacitor are in a same layer, and the first electrode and the second electrode of the transistor are in a same layer.

17. The display substrate according to claim 16, wherein the first initial signal line and another capacitor electrode plate of the storage capacitor of the pixel circuit are in a same layer.

18. A display apparatus, comprising the display substrate according to claim 1, wherein the display apparatus comprises a display panel and a photosensitive sensor disposed on a side of a non-display surface of the display panel, the display panel comprises the display substrate, and an orthographic projection of the photosensitive sensor on the display panel is overlapped with the first display region of the display substrate of the display panel.

\* \* \* \* \*